(12) United States Patent
Chao

(10) Patent No.: US 9,583,151 B2
(45) Date of Patent: Feb. 28, 2017

(54) LOCKING DEVICE

(71) Applicant: Wistron Corporation, New Taipei (TW)

(72) Inventor: Chien-Hsing Chao, New Taipei (TW)

(73) Assignee: Wistron Corporation, New Taipei (TW)

( * ) Notice: Subject to any disclaimer, the term of this patent is extended or adjusted under 35 U.S.C. 154(b) by 543 days.

(21) Appl. No.: 14/157,467

(22) Filed: Jan. 16, 2014

(65) Prior Publication Data
US 2014/0205394 A1   Jul. 24, 2014

(30) Foreign Application Priority Data

Jan. 18, 2013 (TW) .............................. 102102008 A

(51) Int. Cl.
*E05C 1/08* (2006.01)
*G11B 33/12* (2006.01)
(Continued)

(52) U.S. Cl.
CPC ............ *G11B 33/128* (2013.01); *E05C 1/002* (2013.01); *E05C 1/085* (2013.01); *G06F 1/187* (2013.01);
(Continued)

(58) Field of Classification Search
CPC ......... E05B 5/00; G11B 33/128; G06F 1/187; E05C 1/002; E05C 1/085; H05K 7/1411; Y10T 292/0969
See application file for complete search history.

(56) References Cited

U.S. PATENT DOCUMENTS 6,142,590 A * 11/2000 Harwell ............... H05K 7/1494
                                                                312/208.1
6,212,921 B1 * 4/2001 Knighton ............ E05B 73/0082
                                                                248/551

(Continued)

FOREIGN PATENT DOCUMENTS

CN        2914172 Y     6/2007
TW        467307 U     12/2001
(Continued)

OTHER PUBLICATIONS

The Office Action issued to Taiwanese Counterpart Application No. 102102008 by the Taiwan Intellectual Property Office on Nov. 13, 2014 along with an abridged English translation of the sections boxed in red.

(Continued)

*Primary Examiner* — Joshua J Michener
*Assistant Examiner* — Matthew Gitlin
(74) *Attorney, Agent, or Firm* — Winston Hsu; Scott Margo

(57) ABSTRACT

A locking device for fixing an electronic component to a housing includes a rear stop frame adapted to be disposed on the housing for fixing a rear side of the electronic component, a front frame spaced apart from and in front of the rear stop frame and having a retaining portion, and a locking mechanism including a positioning frame for fixing a front side of the electronic component, and a locking member disposed on the positioning frame and releasably engaged to the retaining portion. The locking member is engaged to the retaining portion to fix the positioning frame on the front frame.

24 Claims, 31 Drawing Sheets

(51) Int. Cl.
*E05C 1/00* (2006.01)
*G06F 1/18* (2006.01)
*H05K 7/14* (2006.01)

(52) U.S. Cl.
CPC ....... *H05K 7/1411* (2013.01); *Y10T 292/0969* (2015.04)

(56) References Cited

U.S. PATENT DOCUMENTS

| | | | | |
|---|---|---|---|---|
| 6,339,532 B1* | 1/2002 | Boulay | ............... | G06F 1/184 312/223.1 |
| 6,442,030 B1* | 8/2002 | Mammoser | ......... | G06F 1/1601 248/917 |
| 6,856,505 B1* | 2/2005 | Venegas | ............... | G06F 1/1601 361/679.05 |
| 7,259,959 B2* | 8/2007 | Tu | ............... | G06F 1/187 248/694 |
| 7,426,116 B1* | 9/2008 | Peng | ............... | G06F 1/184 361/727 |
| 7,561,441 B1* | 7/2009 | Chang | ............... | G06F 1/187 312/223.1 |
| 7,719,834 B2 | 5/2010 | Miyamoto et al. | | |
| 7,808,795 B2* | 10/2010 | Lu | ............... | H05K 7/1491 312/223.1 |
| 7,823,934 B2* | 11/2010 | Huang | ............... | G11B 33/12 248/27.1 |
| 8,087,736 B2* | 1/2012 | Chang | ............... | H05K 7/1489 312/223.1 |
| 8,596,730 B2* | 12/2013 | Chen | ............... | G06F 1/181 312/223.2 |
| 8,763,967 B2* | 7/2014 | Fu | ............... | G06F 1/187 211/26.2 |
| 8,867,213 B2* | 10/2014 | Furuta | ............... | G06F 1/183 312/223.2 |
| 2003/0161118 A1 | 8/2003 | Bovell | | |
| 2003/0169565 A1* | 9/2003 | Wang | ............... | G06F 1/184 361/679.33 |
| 2004/0173544 A1 | 9/2004 | Chen | | |
| 2005/0088825 A1* | 4/2005 | Miyamura | ............... | G06F 1/18 361/715 |
| 2006/0002783 A1* | 1/2006 | Rudduck | ............... | F16B 1/0014 411/107 |
| 2011/0279927 A1* | 11/2011 | Lee | ............... | G11B 33/128 360/133 |
| 2012/0212905 A1* | 8/2012 | Furuta | ............... | H05K 7/1489 361/679.58 |
| 2013/0201626 A1* | 8/2013 | Bondurant | ............... | G06F 1/1658 361/679.58 |
| 2013/0256490 A1* | 10/2013 | Fu | ............... | G06F 1/187 248/316.1 |

FOREIGN PATENT DOCUMENTS

| | | |
|---|---|---|
| TW | 564968 U | 12/2003 |
| TW | M286556 | 1/2006 |
| TW | M290577 | 5/2006 |
| TW | 200847897 | 12/2008 |
| TW | I323882 | 4/2010 |
| TW | M430137 | 5/2012 |
| TW | I369935 | 8/2012 |

OTHER PUBLICATIONS

Office action mailed/issued on Oct. 9, 2016 for CN application No. 201310060462.8, p. 3 line 4-31 and p. 4 line 1-16.

* cited by examiner

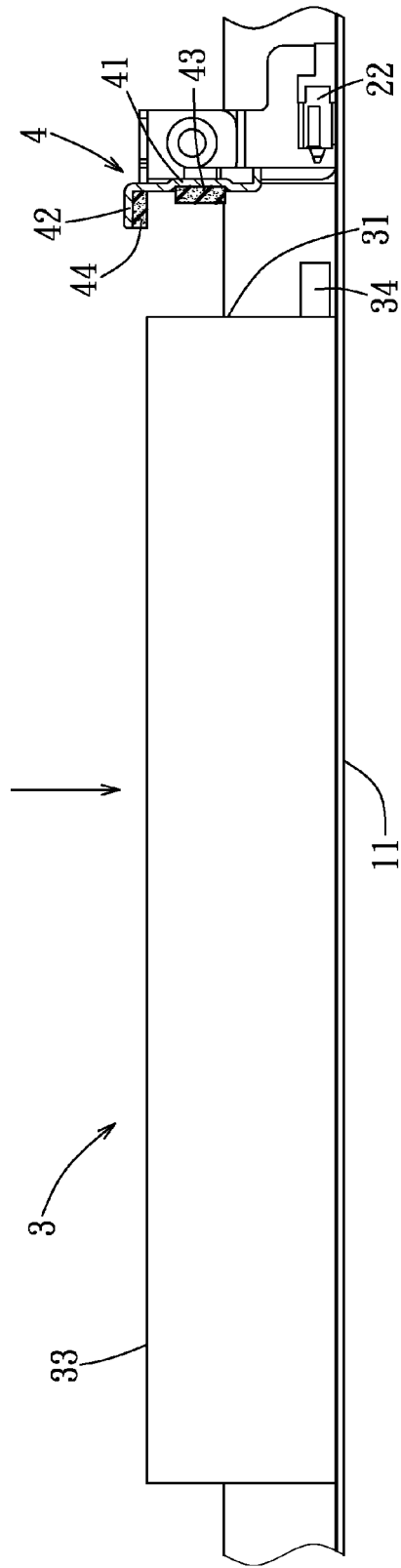
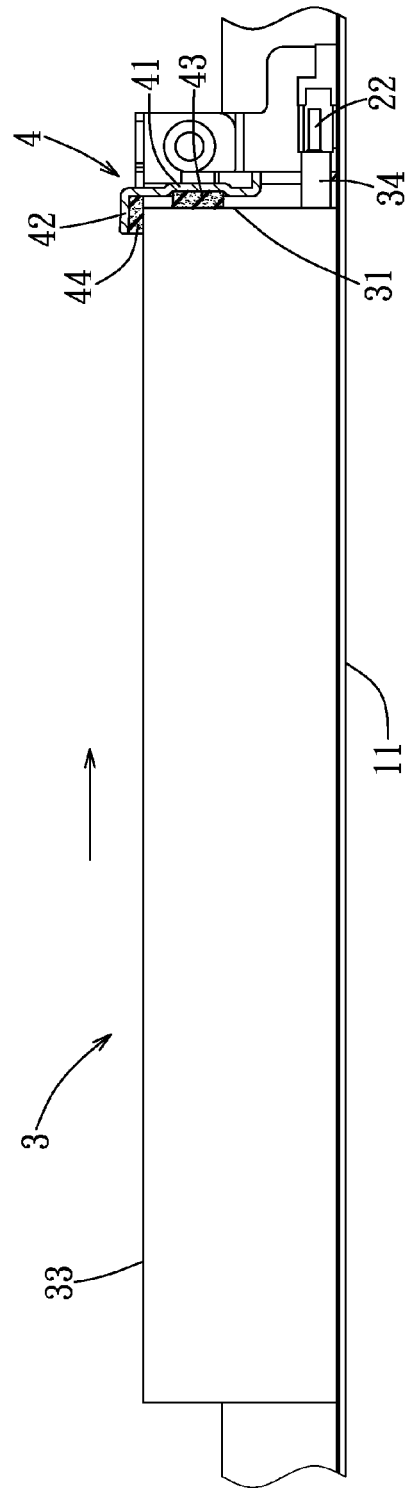

LOCKING DEVICE

CROSS-REFERENCE TO RELATED APPLICATION

This application claims priority of Taiwanese Patent Application No. 102102008, filed on Jan. 18, 2013.

BACKGROUND OF THE DISCLOSURE

1. Field of the Disclosure

The disclosure relates to a locking device, more particularly to a locking device for fixing an electronic component to a housing.

2. Description of the Related Art

Existing server hard drives are fixedly installed in a server housing through a bracket. To install the hard drive in the server housing, the hard drive must first be placed in a bracket, after which screws are used to securely fix the hard drive therein. Once secured, the bracket is fixedly installed in the server housing to complete the installation process. Additionally, to detach the hard drive from the server housing for repair or replacement, the bracket must first be dismantled from the server housing, followed by removal of the screws from the bracket to release the hard drive therefrom.

However, the installation and detachment of the hard drive to and from the server housing require an auxiliary tool, such as a screwdriver, and the securing mechanism must also be manipulated to secure the bracket in the server housing or to release the locking device from and between the bracket and the server housing. Therefore, the entire process does not only involve complex steps and inconvenience, but also consumes many working hours. Moreover, the aforementioned method of fixing the hard drive to the server housing through the bracket involves the use of a great number of securing elements, thereby resulting in complex structure and high manufacturing cost of the server.

SUMMARY OF THE DISCLOSURE

Therefore, an object of the present disclosure is to provide a locking device that has a simple structure and that is easy to operate so that an electronic component can be easily fixed to and disassembled from a housing, thereby reducing the working hours for assembly and disassembly as well as the associated production cost.

Another object of the present disclosure is to provide a locking device that can quickly fix or disassemble an electronic component to and from a housing while dispensing with the need of using a bracket or an auxiliary tool.

The purpose of the present disclosure and the solution to the conventional technical problems are achieved through employment of the below technical means. According to one aspect of disclosure of the present disclosure, a locking device suitable for fixing an electronic component to a housing comprises a rear stop frame, a front frame, and a locking mechanism.

The rear stop frame is adapted to be disposed on the housing for fixing a rear side of the electronic component. The front frame is adapted to be disposed on the housing. The front frame is spaced apart from and in front of the rear stop frame, and includes a retaining portion. The locking mechanism includes a positioning frame for fixing a front side of the electronic component, and a locking member disposed on the positioning frame and releasably engaged to the retaining portion. The locking member is engaged to the retaining portion to fix the positioning frame on the front frame.

The rear stop frame includes a rear stop plate for blocking a rear end face of the electronic component, and the positioning frame includes a front stop plate for blocking a front end face of the electronic component.

The rear stop frame further includes a rear buffer pad disposed on the rear stop plate for abutting against the rear end face of the electronic component. The positioning frame further includes an elastic packing member disposed on the front stop plate for abutting against the front end face of the electronic component. The elastic packing member is adapted to bias the electronic component toward the rear buffer pad.

The rear stop frame further includes a first top stop plate connected to a top end of the rear stop plate. The positioning frame further includes a second top stop plate connected to a top end of the front stop plate. The first and second top stop plates are adapted to block a top face of the electronic component.

The rear stop frame further includes a first buffer pad disposed on a bottom end of the first top stop plate, and the positioning frame further includes a second buffer pad disposed on a bottom end of the second top stop plate.

The front frame further includes an upright plate. The retaining portion is configured as an engaging hole that is formed in the upright plate. The locking member includes a casing fixed to the positioning frame, a locking bolt that extends through the casing and that releasably engages the retaining portion, and a biasing spring disposed in the casing and biasing the locking bolt toward a first horizontal direction so as to engage the locking bolt with the retaining portion.

The upright plate includes an upright plate portion, and an inclined plate portion extending obliquely from a top end of the upright plate portion. The inclined plate portion has an inclined guide surface to contact and move the locking bolt along a second horizontal direction that is opposite to the first horizontal direction.

The casing defines a passage hole. The locking bolt includes a bolt rod that extends through the passage hole and that partially projects out of the casing, an annular flange that extends outwardly and radially from an outer peripheral surface of the bolt rod and that is disposed in the passage hole, and a bolt head disposed on an end of the bolt rod and that is located on an outer side of the casing. The biasing spring is sleeved on the bolt rod and abuts between the annular flange and the casing.

The front frame further includes at least one supporting flat plate. The supporting flat plate is formed with a positioning hole. The positioning frame further includes a lower plate that is connected to a bottom end of the front stop plate and that abuts against the supporting flat plate, and at least one positioning pin that protrudes from a bottom end of the lower plate and that engages the positioning hole.

The lower plate is formed with a through hole for extension of the upright plate therethrough. The front frame includes two supporting flat plates that are respectively disposed on left and right sides of the upright plate. The positioning frame includes two positioning pins. Each of the positioning pins is engaged to the positioning hole in a respective one of the supporting flat plates.

The retaining portion is configured as a hook. The positioning frame further includes two retaining members projecting from the front stop plate and spaced apart from each other in a left-right direction. Each of the retaining members is formed with a retaining hole. The locking member is rotatably received in the retaining holes of the retaining members and is releasably engaged to the retaining portion.

The hook includes an upright arm, and a hook body that is formed on a top end of the upright arm and that has a hook portion. The locking member includes two abutment rods that are spaced apart from each other in a left-right direction and that abut against the front stop plate, two pivot rods extending oppositely, outwardly and respectively from one ends of the abutment rods, two inclined rods extending forwardly, inclinedly and respectively from the other ends of the abutment rods that are opposite to the pivot rods, and a press rod interconnecting the inclined rods. The pivot rods are pivotally connected to the retaining holes in the retaining members. One of the inclined rods is engageable with the hook portion.

The hook body further has an upper inclined surface to contact and push the one of the inclined rods toward the other one of the incline rods.

The front frame further includes two supporting flat plates respectively disposed on left and right sides of the retaining portion. Each of the supporting flat plates is formed with a positioning hole. The positioning frame further includes a lower plate that is connected to a bottom end of the front stop plate and that abuts against the supporting flat plates, and two positioning pins projecting from a bottom end of the lower plate. Each of the positioning pins engages the positioning hole in a respective one of the supporting flat plates.

The front frame further includes a supporting flat plate. The retaining portion is configured as a threaded hole that is formed in the supporting flat plate. The positioning frame further includes a lower plate that is connected to a bottom end of the front stop plate and that abuts against the supporting flat plate. The locking member includes a fixed sleeve fixed to the lower plate, and a locking bolt that extends through and that is rotatable relative to the fixed sleeve. The locking bolt extends through the lower plate and threadedly engages the threaded hole.

The supporting flat plate is further formed with a positioning hole. The positioning frame further includes a positioning pin that projects from a bottom end of the lower plate and that engages the positioning hole. The locking bolt includes a rotary sleeve rotatably sleeved on an outer periphery of the fixed sleeve, and a threaded rod section that extends from an inner surface of the rotary sleeve and that extends through the fixed sleeve to threadedly engage the threaded hole.

According to another aspect of disclosure of the present disclosure, a locking device for fixing an electronic component to a housing comprises a rear stop frame and a locking mechanism.

The rear stop frame is adapted to be disposed on the housing for fixing a rear side of the electronic component, and includes a rear stop plate for blocking a rear end face of the electronic component, and a first top stop plate connected to a top end of the rear stop plate for blocking a top face of the electronic component. The locking mechanism includes a positioning frame and a locking member. The positioning frame is for fixing a front side of the electronic component, and includes a front stop plate for blocking a front end face of the electronic component, a second top stop plate connected to a top end of the front stop plate for blocking the top face of the electronic component, and two pivot plates adapted to be rotatably connected to the housing. The locking member is disposed on one of the pivot plates and is adapted to be releasably engaged to the housing.

The rear stop frame further includes a rear buffer pad that is disposed on the rear stop plate and that is adapted to abut against the rear end face of the electronic component, and a first buffer pad that is disposed on a bottom end of the first stop plate and that is adapted to abut against the top face of the electronic component. The positioning frame further includes a front buffer pad that is disposed on the front stop plate and that is adapted to abut against the front end face of the electronic component, and a second buffer pad that is disposed on a bottom end of said second top stop plate and that is adapted to abut against the top face of the electronic component.

The housing includes a positioning part that is configured as a projection. The locking member is configured as an engaging hole for engagement with the projection.

The locking mechanism further includes a spring member having one end for connection with the housing and another end connected to the second top stop plate for biasing downwardly the positioning frame.

The housing includes a positioning part that is configured as an engaging hole. The locking member includes a casing fixed to a corresponding pivot plate, a locking bolt that extends through the casing and that is adapted to releasably engage the positioning part, and a biasing spring disposed in the casing for biasing the locking bolt toward the positioning part.

The locking mechanism further includes a spring member having one end for connection with the housing and another end connected to the second top stop plate for biasing downwardly the positioning frame.

The casing defines a passage hole. The locking bolt includes a bolt rod that extends through the passage hole and that partially projects out of the casing, an annular flange that extends outwardly and radially from an outer peripheral surface of the bolt rod and that is disposed in the passage hole, and a bolt head disposed on an end of the bolt rod and that is located on an outer side of the casing. The biasing spring is sleeved on the bolt rod and abuts between the annular flange and the casing.

The housing includes a positioning part that is configured as a threaded hole. One of the locking members includes a fixed sleeve fixed to a corresponding the pivot plate, and a locking bolt that extends through and that is rotatable relative to the fixed sleeve. The locking bolt extends through the pivot plate and is adapted to threadedly engage the threaded hole. The locking bolt includes a rotary sleeve rotatably sleeved on an outer periphery of the fixed sleeve, and a threaded rod section that extends from an inner surface of the rotary sleeve and that extends through the fixed sleeve for threadedly engaging the threaded hole.

Through the aforesaid technical means, the advantages and effectiveness of the locking device according to the present disclosure reside in that through the simple structural design of the locking device, the locking device can quickly fix an electronic component to the housing or disassemble the same from the housing for repair or replacement while dispensing with the need of using a bracket or an auxiliary tool. The entire assembly and disassembly processes are very easy, which leads to reduction in working hours of assembly or disassembly as well as the associated manufacturing cost. Moreover, since each electronic component can be fixed in the housing by using the locking device and dispensing with the need of a bracket, a space to be occupied by the bracket in the housing can be reduced, so that the housing can accommodate more electronic components under a limited amount of space.

BRIEF DESCRIPTION OF THE DRAWINGS

Other features and advantages of the present disclosure will become apparent in the following detailed description of the embodiments with reference to the accompanying drawings, of which:

FIG. 5 is a schematic side view of the first embodiment, illustrating how an electronic component is placed on a bottom plate of the electronic equipment;

FIG. 6 is a view similar to FIG. 5, but illustrating an electrical connector of the electronic component being connected to an electrical connector of an electronic device of the electronic equipment;

DETAILED DESCRIPTION OF THE PREFERRED EMBODIMENTS

Figure 1:
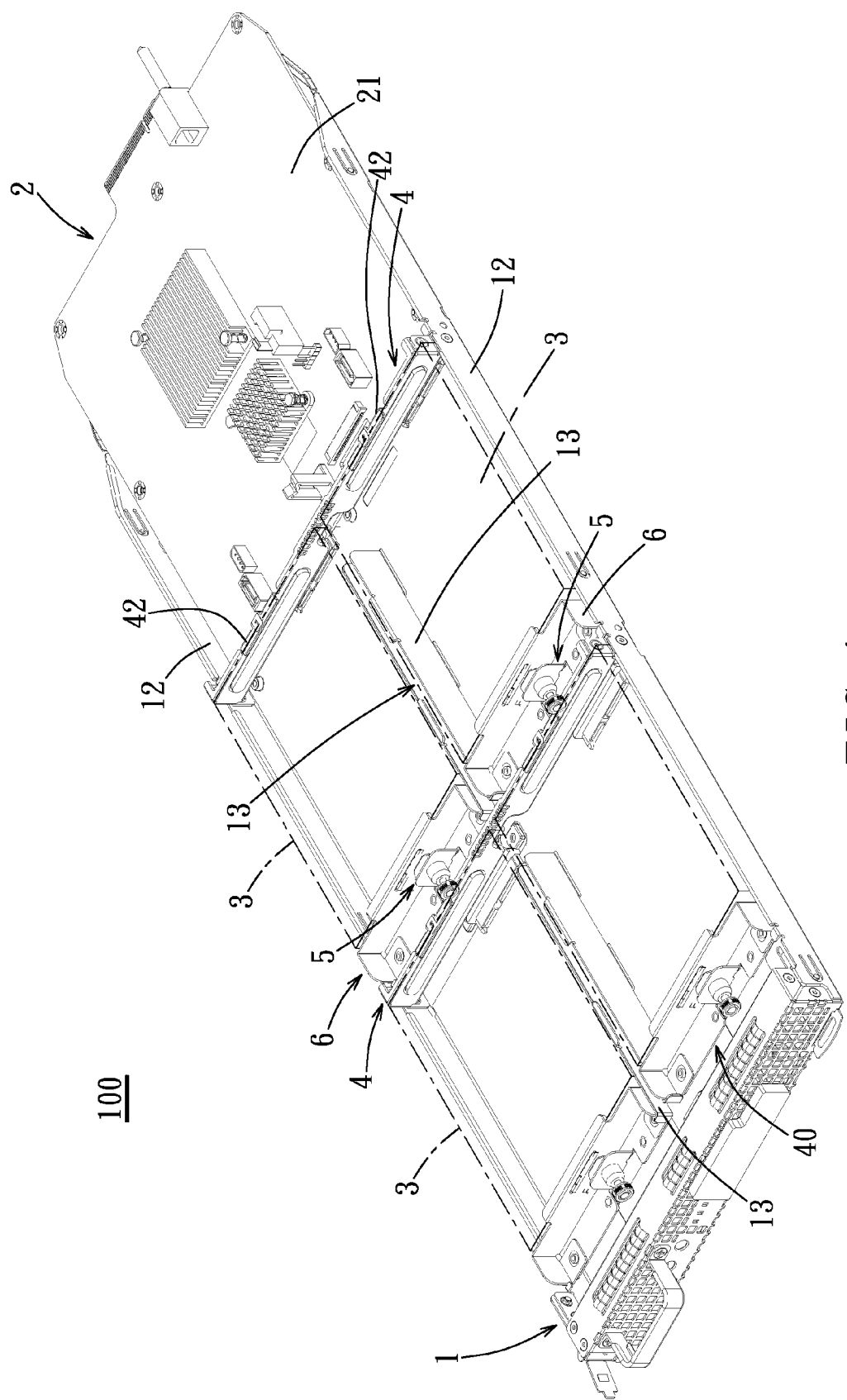
FIG. 1 is a perspective view of an electronic equipment incorporating a locking device according to the first embodiment of the present disclosure.

The above-mentioned and other technical contents, features, and effects of this disclosure will be clearly presented from the following detailed description of six embodiments in coordination with the reference drawings.

Before this disclosure is described in detail, it should be noted that, in the following description, similar elements are designated by the same reference numerals.

Figure 2:
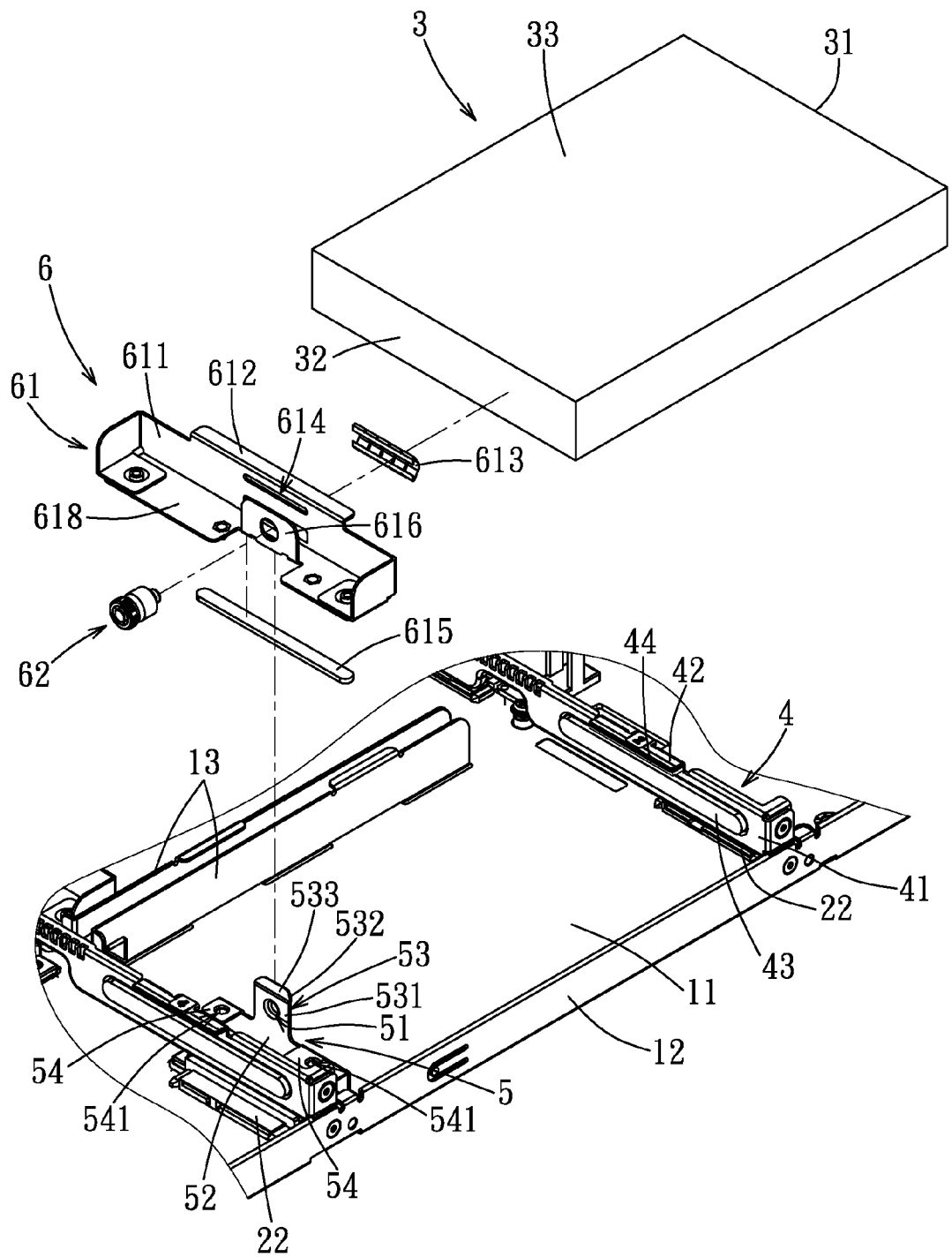
FIG. 2 is a fragmentary partly exploded perspective view of FIG. 1.

Referring to FIGS. 1 and 2, the first embodiment of a locking device 40 according to the present disclosure is adapted to be applied to an electronic equipment 100. The electronic equipment 100 includes a housing 1, an electronic device 2 disposed in the housing 1, a plurality of electronic components 3 disposed in the housing 1, and a locking device 40 for fixing the electronic components 3 in the housing 1. In this embodiment, the electronic equipment 100 is exemplified as a server, and each of the electronic components 3 is exemplified as a hard drive. Alternatively, the electronic equipment 100 may be a data storage device or applicable in a storage equipment for online cloud storage.

Figure 3:
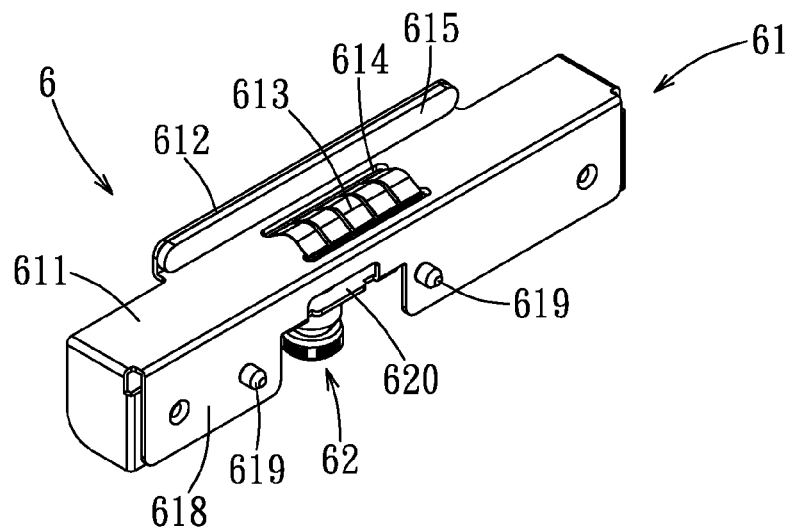
FIG. 3 is a perspective view of a locking mechanism of the locking device of the first embodiment.

As shown in FIGS. 1 to 3, the electronic device 2 includes a motherboard 21, and a plurality of electrical connectors 22 electrically connected to the motherboard 21. Each of the electronic components 3 can be electrically connected to a respective electrical connector 22. The locking device 40 includes a plurality of rear stop frames 4, a plurality of front frames 5 and a plurality of locking mechanisms 6. Each of the rear stop frames 4 is disposed in the housing 1 for fixing a rear side of a corresponding electronic component 3. Each of the front frames 5 is disposed in the housing 1 spaced apart from and in front of a corresponding rear stop frame 4, and includes a retaining portion 51. Each of the locking mechanisms 6 includes a positioning frame 61 for fixing a front side of the corresponding electronic component 3, and a locking member 62 releaseably connected to the retaining portion 51. The locking member 62 is connected to the retaining portion 51 to fix the positioning frame 61 to a corresponding front frame 5.

The specific structure and operation of the locking device 40 will be described in detail below.

With reference to FIGS. 1 to 3, the housing 1 includes a bottom plate 11, two side plates 12 respectively disposed on left and right sides of the bottom plate 11, and two pairs of guide plates 13 disposed on the bottom plate 11 and spaced apart in a front-rear direction. The guide plates 13 are disposed between and parallel to the side plates 12 for guiding movement of a corresponding electronic component 3.

The motherboard 21 of the electronic device 2 is disposed on the bottom plate 11 in proximity to a rear end thereof. In this embodiment, there are four electrical connectors 22 each located between one of the pairs of the guide plates 13 and the corresponding side plate 12. Two of the electrical connectors 22 are proximate to a rear end of a corresponding pair of the guide plates 13 and are disposed on the motherboard 21. The other two electrical connectors 22 are disposed on the bottom plate 11 in proximity to a rear end of the other corresponding pair of the guide plates 13 and are electrically connected to the motherboard 21 via conductive wires (not shown). In this embodiment, there are four electronic components 3 each having a rear end face 31 and a front end face 32.

The number of the rear stop frames 4 of the locking device 40 is two. The rear stop frames 4 are spaced apart from each other in a front-rear direction. Each of the rear stop frames 4 is disposed above two of the corresponding electrical connectors 22 and is fixed to and disposed between the side plates 12 through, for example, a screw fastening method. Each rear stop frame 4 includes a rear stop plate 41 for blocking the rear end face 31 of the corresponding electronic component 3. The number of the front frames 5 is four. Each of the front frames 5 is disposed on the bottom plate 11, and is located between a front end of one of the pairs of the guide plates 13 and the corresponding side plate 12. The number of the locking mechanisms 6 is four. The positioning frame 61 of each locking mechanism 6 is assembled on a corresponding front frame 5, and includes a front stop plate 611 for blocking the front end face 32 of the corresponding electronic component 3. Through the rear stop plate 41 of each rear stop frame 4 that blocks the rear end face 31 of the corresponding electronic component 3, through the front stop plate 611 of the positioning frame 61 of each locking mechanism 6 that blocks the front end face 32 of the corresponding electronic component 3, and through the abutment of each guide plate 13 and the corresponding side plate 12 respectively against left and right sides of the corresponding electronic component 3, the corresponding electronic component 3 can be prevented from moving back and forth or sideways due to vibration of the housing 1. Hence, each electronic component 3 can be fixed in a plugged position (see FIG. 1) in which each electronic component 3 is electrically connected to the respective electrical connector 22.

In order for each of the electronic components 3 to be further stably fixed in the plugged position, in this embodiment, each of the rear stop frames 4 further includes two first top stop plates 42 connected to a top end of the rear stop plate 41, and the positioning frame 61 further includes a second top stop plate 612 connected to a top end of the front stop plate 611. Each of the first and second top stop plates 42, 612 are used for blocking the top face 33 of the corresponding electronic component 3 to prevent the electronic component 3 from moving up and down due to vibration of the housing 1.

Because the length and height dimensions of the electronic component 3 made by different manufacturers with the same product specification (for example, 3.5 inches) will remain slightly different from one another, and in order for the locking device 40 to fix the electronic component 3 made by different manufacturers to enhance its flexibility of use, in this embodiment, each of the rear stop frames 4 further includes two rear buffer pads 43 disposed on the rear stop plate 41. Each of the rear buffer pads 43 is made of rubber or silicone, and is adhered to a front side of the rear stop plate 41 using an adhesive for abutting against the rear end face 31 of the corresponding electronic component 3. The positioning frame 61 further includes an elastic packing member 613 disposed on the front stop plate 611. The front stop plate 611 is formed with two elongated slots 614 spaced apart in a top-bottom direction, and top and bottom ends of the elastic packing member 613 are respectively inserted into the elongated slots 614 to be clamped and fixed onto the front stop plate 611 (see FIGS. 7 and 8). The elastic packing member 613 is used for abutting against the front end face 32 of the electronic component 3 and for biasing the electronic component 3 towards the rear buffer pad 43. When the locking device 40 is used for fixing an electronic component 3 made by a different manufacturer with the same specification, the rear buffer pad 43 of each rear stop frame 4 and the corresponding elastic packing member 613 can abut respectively and tightly against the rear and front end faces 31, 32 of the electronic component 3, thereby preventing the electronic component 3 from moving back and forth. In addition, each of the rear stop frames 4 further includes two first buffer pads 44 respectively disposed on the first top stop plates 42. Each of the first buffer pads 44 is made of rubber or silicone, and is adhered to a bottom end of the respective first top stop plate 42 using an adhesive for abutting against the top face 33 of the corresponding electronic component 3. The positioning frame 61 further includes a second buffer pad 615 disposed on the second top stop plate 612. The second buffer pad 615 is made of rubber or silicone, and is adhered to a bottom end of the second top stop plate 612 using an adhesive for abutting against the top face 33 of the corresponding electronic component 3. When the locking device 40 is used for fixing an electronic component 3 made by a different manufacturer with the same specification, the first buffer pads 44 and the second buffer pad 615 can abut tightly against the top face 33 of the corresponding electronic component 3, thereby preventing the electronic component 3 from moving up and down.

Figure 4:
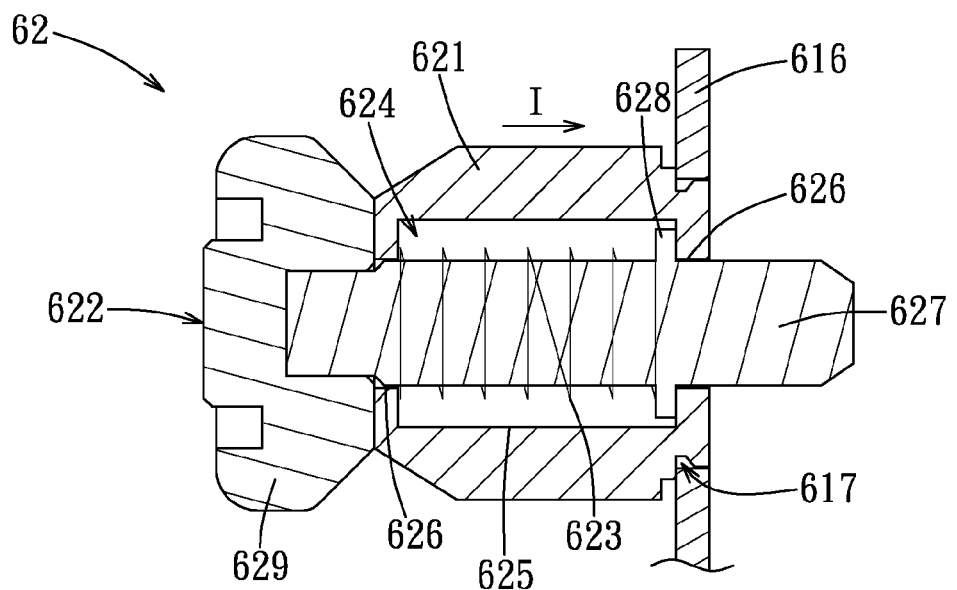
FIG. 4 is a sectional view of a locking member of the locking mechanism of the first embodiment.

Each front frame 5 further includes a connecting plate 52 connected perpendicularly to the bottom plate 11, and an upright plate 53 projecting upwardly from a top end of the connecting plate 52. The retaining portion 51 is configured as an engaging hole that is formed in the upright plate 53. Referring to FIG. 4, in combination with FIGS. 2 and 3, the positioning frame 61 further includes a mounting plate 616. The locking member 62 includes a casing 621 fixed on the mounting plate 616, a locking bolt 622 that extends through the casing 621 and that releasably engages the retaining portion 51, and a biasing spring 623 disposed in the casing 621. The biasing spring 621 is used for biasing the locking bolt 622 toward a first horizontal direction (I) so as to engage the locking bolt 622 with the retaining portion 51. The locking bolt 622 is movable between a first position (see FIG. 9), in which it engages the retaining portion 51, and a second position (see FIG. 10), in which it is moved away and disengaged from the retaining portion 51 and compresses the biasing spring 623. An assembly personnel can operate the locking bolt 622 to fix the locking bolt 622 to or release the same from the upright plate 53. Through this, the positioning frame 61 can be easily and quickly assembled to and disassembled from the front frame 5.

Specifically, the mounting plate 616 is formed with a mounting hole 617, and the casing 621 of the locking member 62 extends into the mounting hole 617. The casing 621 can be retained in the mounting hole 617 in a tight-fitting manner. The casing 621 defines a passage hole 624. The passage hole 624 has a large diameter hole portion 625, and two small diameter hole portions 626 respectively communicating with front and rear ends of the large diameter hole portion 625. A hole diameter of each of the small diameter hole portions 626 is smaller than that of the large diameter hole portion 625. The locking bolt 622 includes a bolt rod 627 that extends through the passage hole 624 and that partially projects out of the casing 621, an annular flange 628 that extends outwardly and radially from an outer peripheral surface of the bolt rod 627 and that is disposed in the large diameter hole portion 625 of the passage hole 624, and a bolt head 629 that is disposed on an end of the bolt rod 627 which is distal from the annular flange 628 and that is located on an outer side of the casing 621. The biasing spring 623 is a compression spring that is sleeved on the bolt rod 627 and that is disposed in the large diameter hole portion 625. Two opposite ends of the biasing spring 623 abut respectively against the annular flange 628 and the casing 621. Because the biasing spring 623 biases the annular flange 628, the locking bolt 622 can be maintained in the first position, where the bolt rod 627 projects out of the casing 621 and engages the retaining portion 51. The assembly personnel can pull the bolt head 629 so that an end of the bolt rod 627 that is distal from the bolt head 629 moves into the passage hole 624 and away from the retaining portion 51. Hence, the bolt rod 627 can be easily and quickly disengaged from the upright plate 53.

Each front frame 5 further includes two supporting flat plates 54 connected perpendicularly to the top end of the connecting plate 52. The supporting flat plates 54 are respectively disposed on left and right sides of the upright plate 53, and each is formed with a positioning hole 541. The positioning frame 61 further includes a lower plate 618 connected to bottom ends of the front stop plate 611 and the mounting plate 616, and two positioning pins 619 projecting from the bottom end of the lower plate 618 and spaced apart from each other in a left-right direction. The lower plate 618 is used to abut against the supporting flat plates 54, and is formed with a rectangular through hole 620 for extension of the upright plate 53 therethrough. After the upright plate 53 extends through the through hole 620, the retaining portion 51 can be aligned with the bolt rod 627 for extension of the bolt rod 627 engagingly therethrough. Each of the positioning pins 619 is used to engage a respective positioning hole 541. Through engagement of the positioning pins 619 with the respective positioning holes 541, the positioning frame 61 is prevented from turning relative to the supporting flat plates 54 or from moving back and forth, so that the positioning frame 61 can be stably positioned on the supporting flat plates 54. It should be noted that the number of each of the supporting flat plate 54 and the positioning pin 619 may be one. In this case, the dimensions of the supporting flat plate 54 must be large to stably support the positioning frame 61. In addition, through the engagement of the bolt rod 627 of the locking bolt 622 with the retaining portion 51 and in coordination with the engagement of the single positioning pin 619 with the single positioning hole 541, the positioning frame 61 can be similarly prevented from turning relative to the supporting flat plate 54 or from moving back and forth.

Referring to FIGS. 5 and 6, in combination with FIG. 2, when it is desired to fixedly assemble an electronic component 3 in the housing 1, the electronic component 3 is first placed downwardly onto the bottom plate 11 such that the left and right sides of the electronic component 3 respectively abut against one of the guide plates 13 and the corresponding side plate 12. Next, the electronic component 3 is pushed rearwardly, and the one of the guide plates 13 and the corresponding side plate 12 guide the electronic component 3 to slide rearwardly, so that an electrical connector 34 of the electronic component 3 can be accurately connected to the respective electrical connector 22. At this time, the rear buffer pad 43 and the first buffer pad 44 of the rear stop frame 4 respectively abut against the rear end face 31 and the top face 33 of the electronic component 3.

Figure 7:
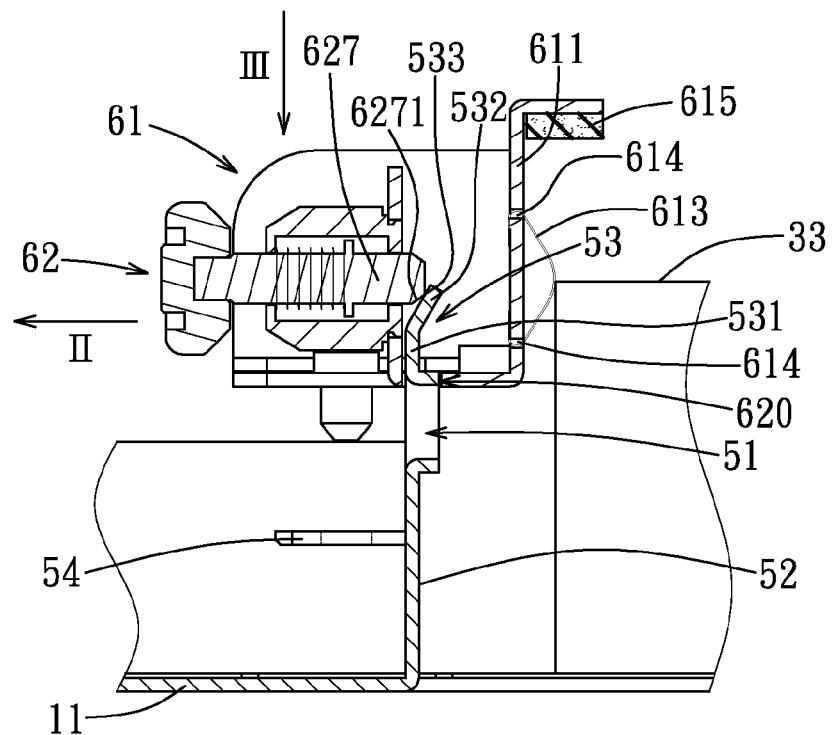
FIG. 7 is a fragmentary sectional view of the first embodiment, illustrating a beveled end of a bolt rod abutting against an inclined guide surface of an inclined plate portion of an upright plate.
Figure 8:
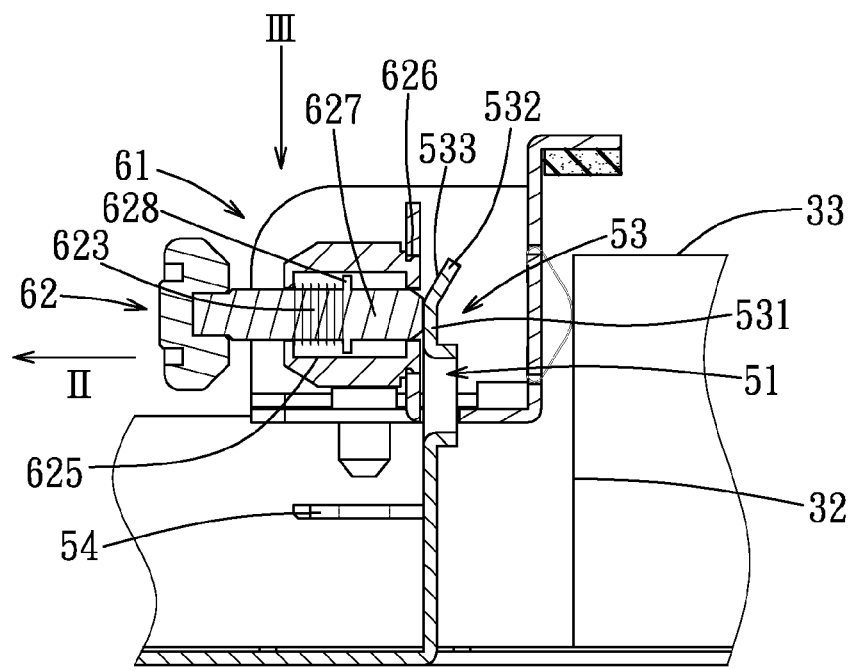
FIG. 8 is a view similar to FIG. 7, but illustrating the bolt rod abutting against an upright plate portion of the upright plate.

Referring to FIGS. 7 and 8, in combination with FIG. 2, the through hole 620 in the positioning frame 61 is brought to align with the upright plate 53 of the front frame 5, after which the positioning frame 61 is moved along an assembly direction (III) so that the upright plate 53 extends through the through hole 620. Because the upright plate 53 includes an upright plate portion 531 that is connected to a top end of the connecting plate 52 and that is formed with the retaining portion 51, and an inclined plate portion 532 that extends upwardly, rearwardly and obliquely from a top end of the upright plate portion 531, during movement of the locking mechanism 6, when a beveled end 6271 of the bolt rod 627, which is proximate to the annular flange 628, comes into contact with an inclined guide surface 533 of the inclined plate portion 532, the inclined guide surface 533 exerts a horizontal component of force against the beveled end 6271 so as to move the bolt rod 627 along a second horizontal direction (II) that is opposite to the first horizontal direction (I). During movement of the bolt rod 627, the annular flange 628 compresses the biasing spring 623 to deform and store a restoring force. When the locking mechanism 6 continues to move along the assembly direction (III), the bolt rod 627 passes over the inclined guide surface 533 and contacts the upright plate portion 531, and the beveled end 6271 of the bolt rod 627 is pushed into the small diameter hole portion 626 of the passage hole 624 that communicates with the rear end of the large diameter hole section 625.

Figure 9:
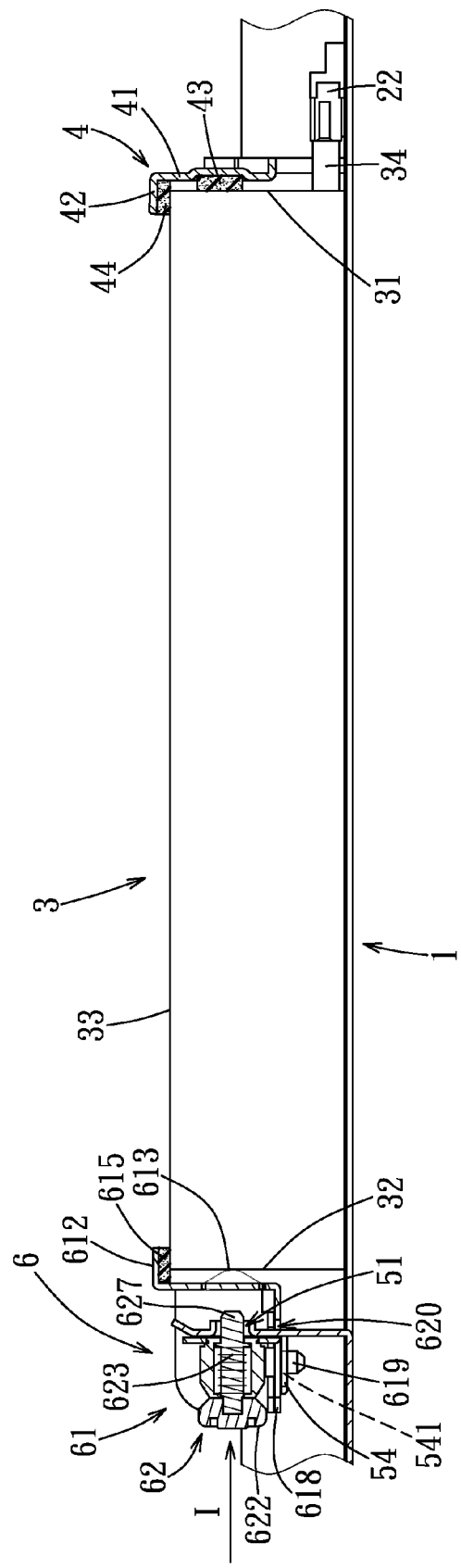
FIG. 9 is a sectional view of the first embodiment, illustrating a locking bolt in a first position that engages a retaining portion of a front frame of the locking device.

Referring to FIG. 9, when the locking mechanism 6 continues to move, each positioning pin 619 of the positioning frame 61 will extend through and engage the respective positioning hole 541, after which the lower plate 618 of the positioning frame 61 will abut against the supporting flat plates 54. At this time, the positioning frame 61 cannot continue to move, the elastic packing member 613 and the second buffer pad 615 respectively abut against the front end face 32 and the top face 33 of the electronic component 3, and the bolt rod 627 is aligned with the retaining portion 51. Through the restoring force of the biasing spring 623 that urges the annular flange 628 (see FIG. 8) to move, the locking bolt 622 can be moved back to the first position along the first horizontal direction (I), and the beveled end 6271 of the bolt rod 627 can extend through and engage the retaining portion 51. As such, the positioning frame 61 can be securely fixed onto the front frame 5 and the electronic component 3 can be stably and simultaneously fixed in the housing 1.

Figure 10:
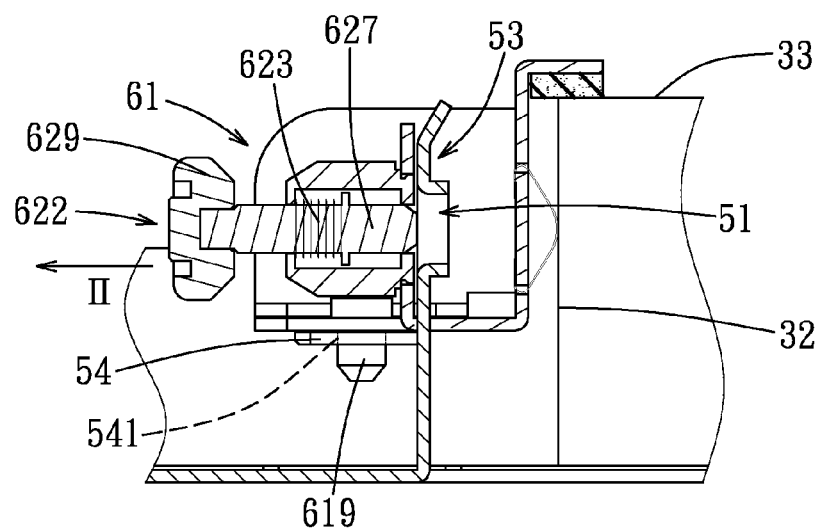
FIG. 10 is a fragmentary sectional view of the first embodiment, illustrating the locking bolt in a second position that disengages from the retaining portion of the front frame.
Figure 11:
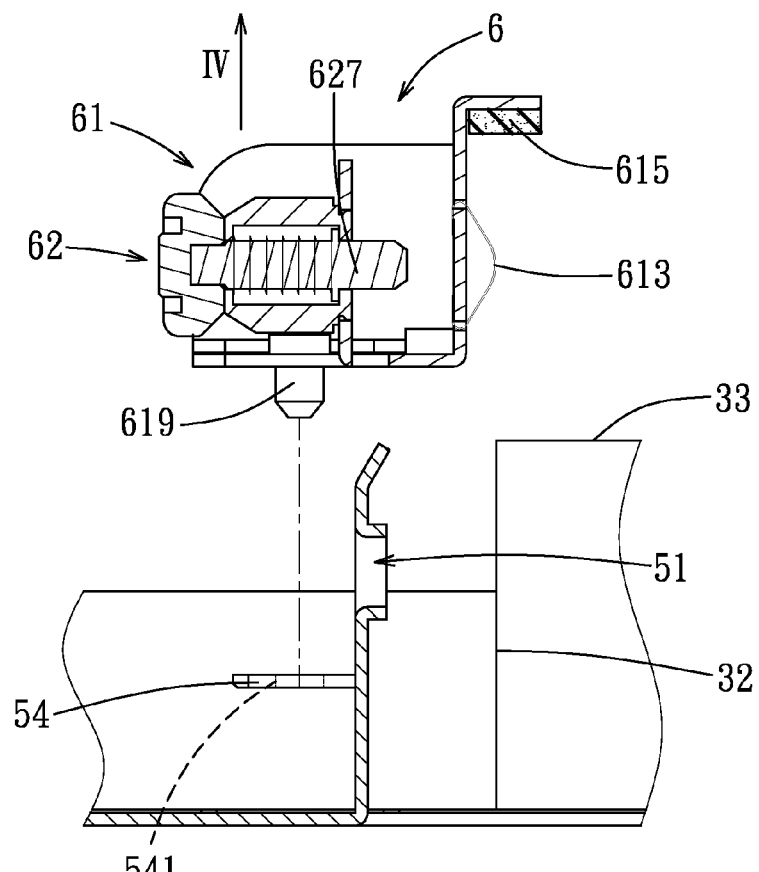
FIG. 11 is a view similar to FIG. 10, but illustrating the locking mechanism being removed from the front frame.

Referring to FIGS. 10 and 11, in combination with FIG. 9, when it is desired to disassemble the electronic component 3 from the housing 1, the bolt head 629 is gripped first and then pulled along the second horizontal direction (II) so as to move the locking bolt 622 to the second position. At this time, the bolt rod 627 is moved away from the retaining portion 51 and is disengaged from the upright plate 53. The locking mechanism 6 is then moved along a disassembly direction (IV) that is opposite to the assembly direction (III) so as to detach each positioning pin 619 from the respective positioning hole 541 and to move the elastic packing member 613 and the second buffer pad 615 respectively away from the front end face 32 and the top face 33 of the electronic component 3. Afterwards, the electronic component 3 is moved forward to disengage the electrical connector 34 from the respective electrical connector 22. Hence, the electronic component 3 can be removed from the housing 1 for repair or replacement.

Due to the design of the locking device 40, to assemble the electronic component 3 into the housing 1, the electronic component is first placed inside the housing 1 to connect the electrical connector 34 to the respective electrical connector 22, followed by the movement of the locking mechanism 6 along the assembly direction (III) so as to be assembled onto the front frame 5. As such, the positioning frame 61 can be securely fixed on the front frame 5, and the electronic component 3 can be simultaneously fixed in the housing 1. On the contrary, to detach the electronic component 3 from the housing 1, the bolt head 629 is first pulled along the second horizontal direction (II) to move the locking bolt 622 to the second position and to disengage the bolt rod 627 from the upright plate 53, after which the locking mechanism 6 is moved along the disassembly direction (IV) to detach from the front frame 5. The electrical connector 34 of the electronic component 3 can then be disengaged from the electrical connector 22 for subsequent removal of the electronic component 3 from the housing 1. The aforementioned assembly and disassembly of the electronic component 3 to and from the housing 1 do not require the use of a bracket or any auxiliary tools, so that the assembly and disassembly thereof are simple and convenient and the assembly personnel can easily and quickly assemble or disassemble the electronic component 3 to or from the housing 1. Hence, the working hours for assembly and disassembly as well as the associated production cost can be reduced to a great extent.

Figure 12:
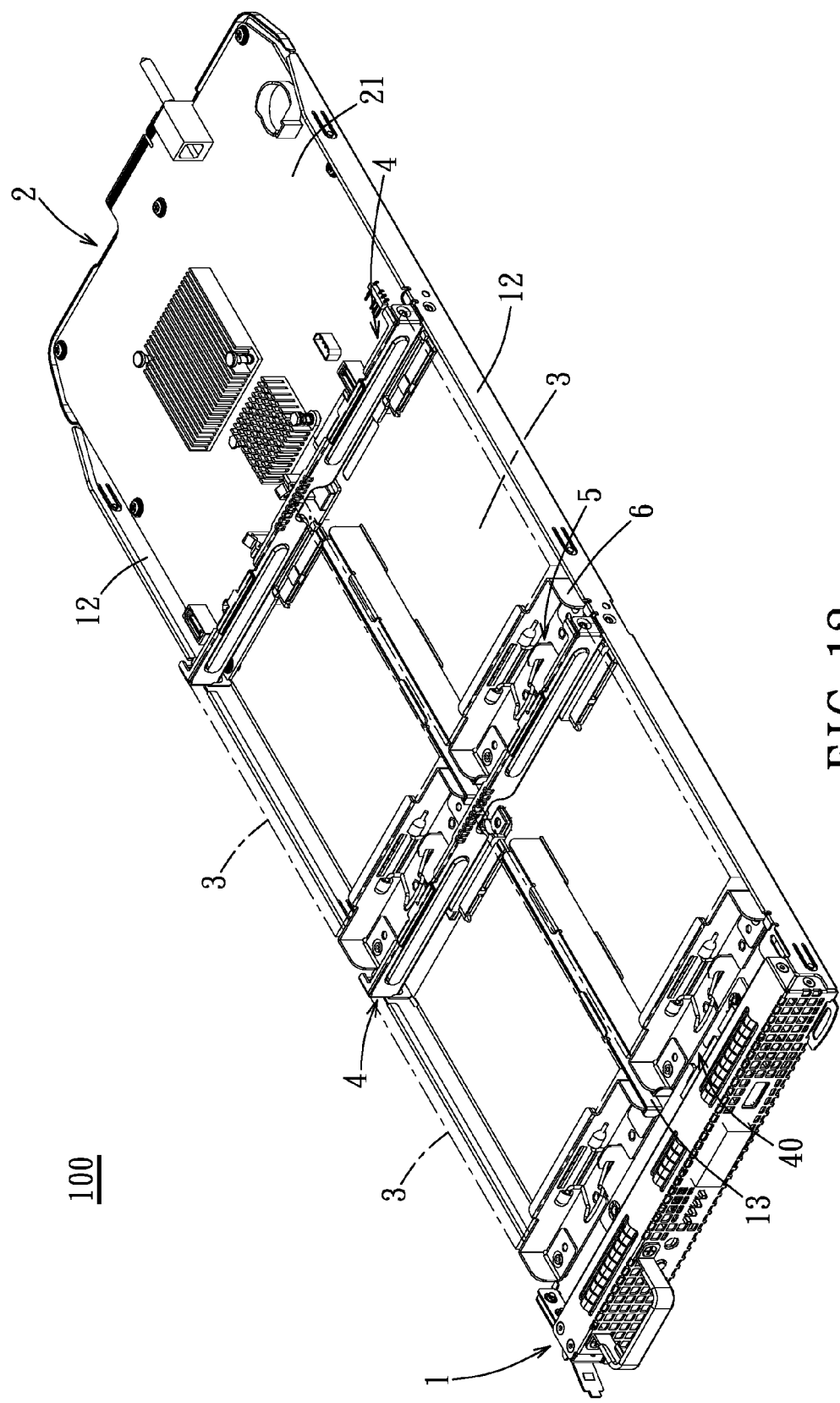
FIG. 12 is a perspective view of the electronic equipment incorporating a locking device according to the second embodiment of the present disclosure.
Figure 13:
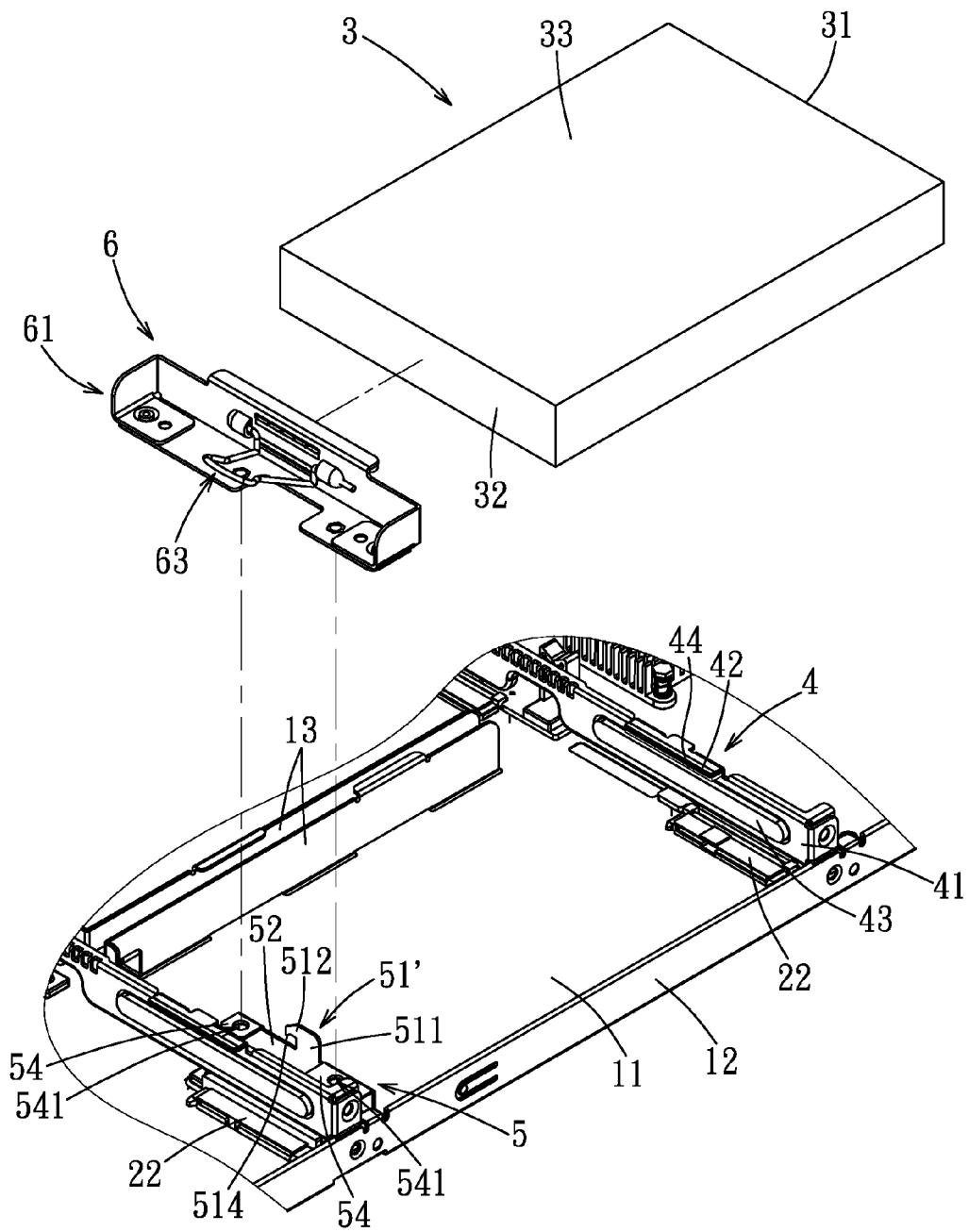
FIG. 13 is a fragmentary partly exploded perspective view of FIG. 12.

Referring to FIGS. 12 and 13, the second embodiment of the locking device 40 according to the present disclosure is shown to be substantially similar to the first embodiment in overall structure, and differs only in the structural design of the front frame 5 and the locking mechanism 6.

Figure 14:
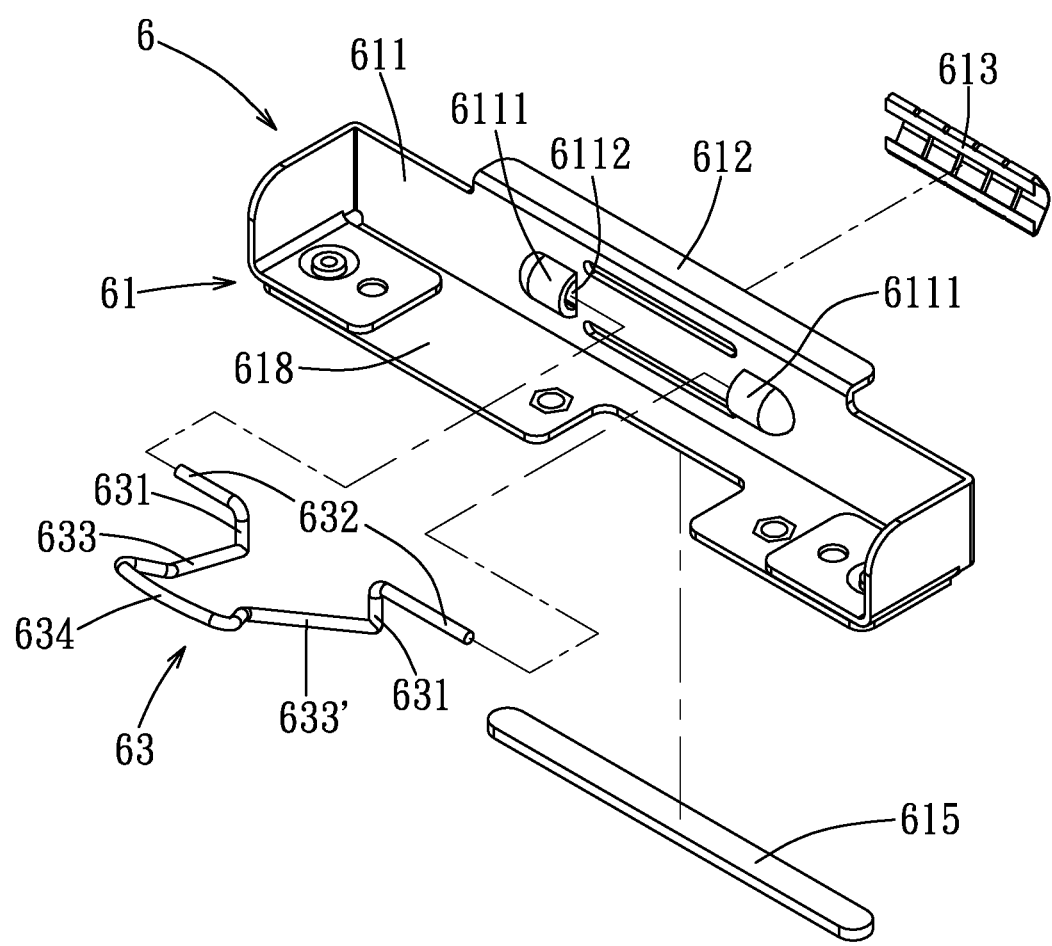
FIG. 14 is an exploded perspective view of a locking mechanism of the second embodiment.
Figure 15:
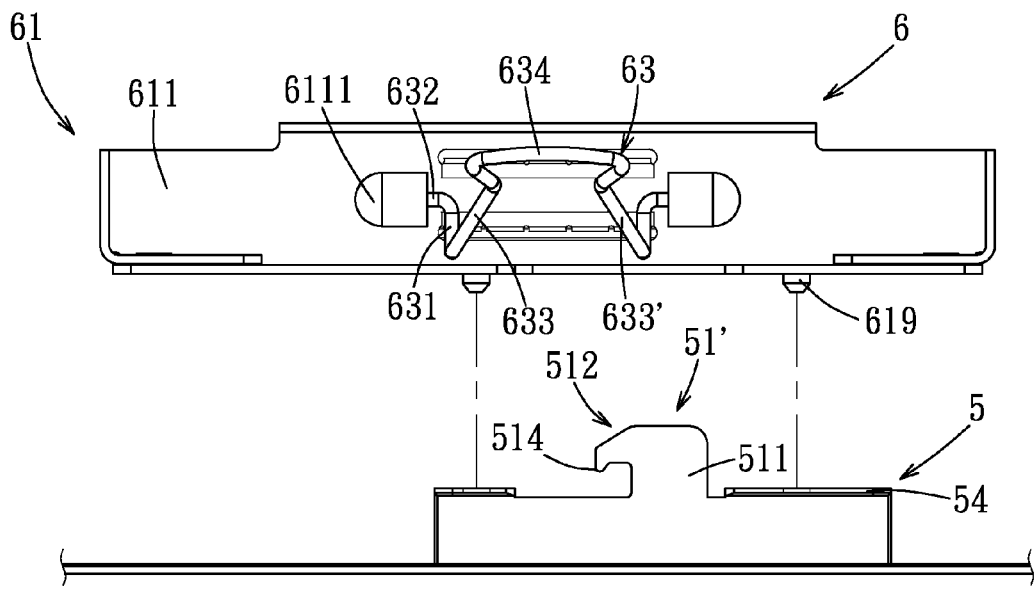
FIG. 15 is a schematic view of the second embodiment, illustrating the locking mechanism being moved towards a front frame of the locking device.

As shown in FIGS. 13, 14 and 15, in this embodiment, the retaining portion 51' of the front frame 5 is configured as a hook, and the positioning frame 61 further includes two retaining members 6111 projecting from a front side of the front stop plate 611 and spaced apart from each other in the left-right direction. Each of the retaining members 6111 is formed with a retaining hole 6112. The locking member 63 is rotatably received in the retaining holes 6112 of the retaining members 6111 and is releasably engaged to the retaining portion 51'. The retaining portion or hook 51' includes an upright arm 511, and a hook body 512 that is formed on a top end of the upright arm 511 and that has a hook portion 514. The locking member 63 is an elastic rod that is made of a metal material, and includes two abutment rods 631 that are spaced apart from each other in the left-right direction and that abut against the front stop plate 611, two pivot rods 632 extending oppositely, outwardly and respectively from one ends of the abutment rods 631, two inclined rods 633, 633' extending forwardly, inclinedly and respectively from the other ends of the abutment rods 631 that are opposite to the pivot rods 632, and a press rod interconnecting the inclined rods 633, 633'. The pivot rods 632 are pivotally connected to the respective retaining holes 6112. The inclined rods 633, 633' extend toward each other. The inclined rod 633' is used for engaging the hook portion 514 of the hook body 512.

Figure 16:
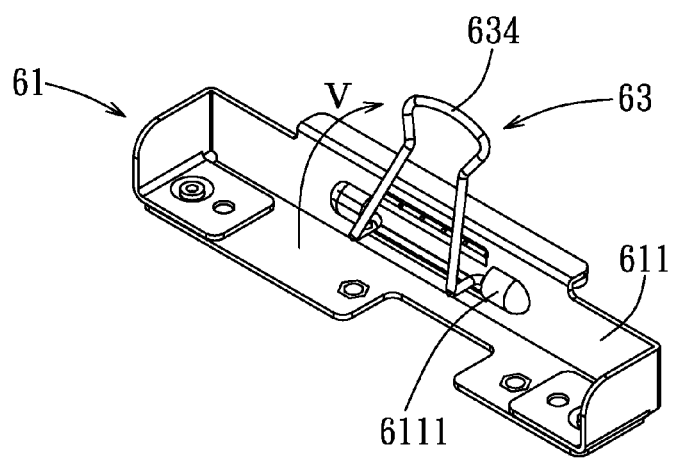
FIG. 16 is an assembled perspective view of the locking mechanism of the second embodiment, illustrating how a locking member is rotated relative to a positioning frame along an arrow (V)

With reference to FIG. 15, to fix the positioning frame 61 on the front frame 5, the press rod 634 of the locking member 63 is first pulled upward along the direction of an arrow (V) (see FIG. 16) to rotate the locking member 63 relative to the front stop plate 611 through engagement of the pivot rods 632 with the retaining holes 6112 of the respective retaining members 6111 until a position shown in FIG. 16 is reached.

Figure 17:
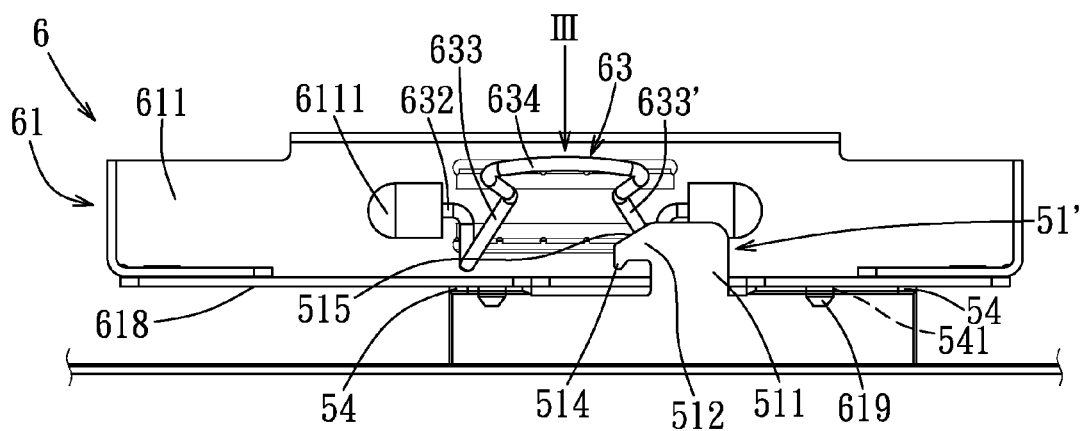
FIG. 17 is a schematic view of the second embodiment, illustrating the locking mechanism being connected to the front frame.

Referring to FIG. 17, the locking mechanism 6 is moved along the assembly direction (III) so as to engage each of the positioning pins 619 with the respective positioning hole 541 and to abut the lower plate 618 against the supporting flat plates 54. At this time, the positioning frame cannot continue to move downward and is positioned on the front frame 5.

Figure 18:
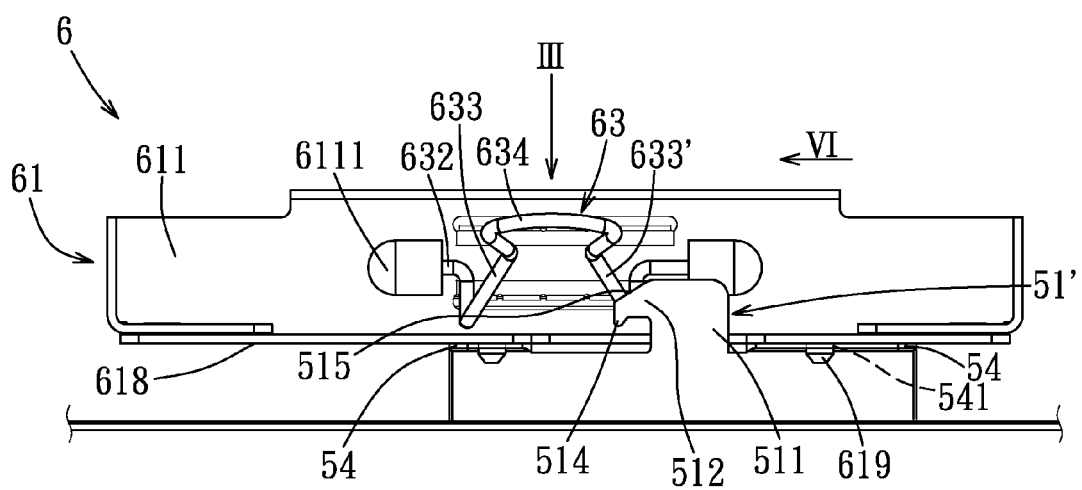
FIG. 18 is a view similar to FIG. 17, but illustrating an inclined rod of the locking member abutting against an upper inclined surface of a hook body.
Figure 19:
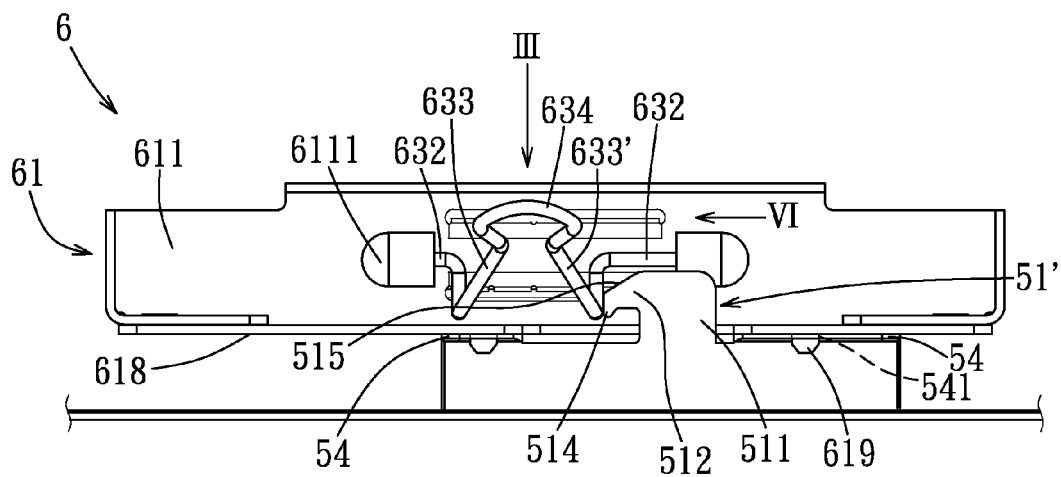
FIG. 19 is a view similar to FIG. 18, but with the inclined rod being moved away from the upper inclined surface of the hook body.
Figure 20:
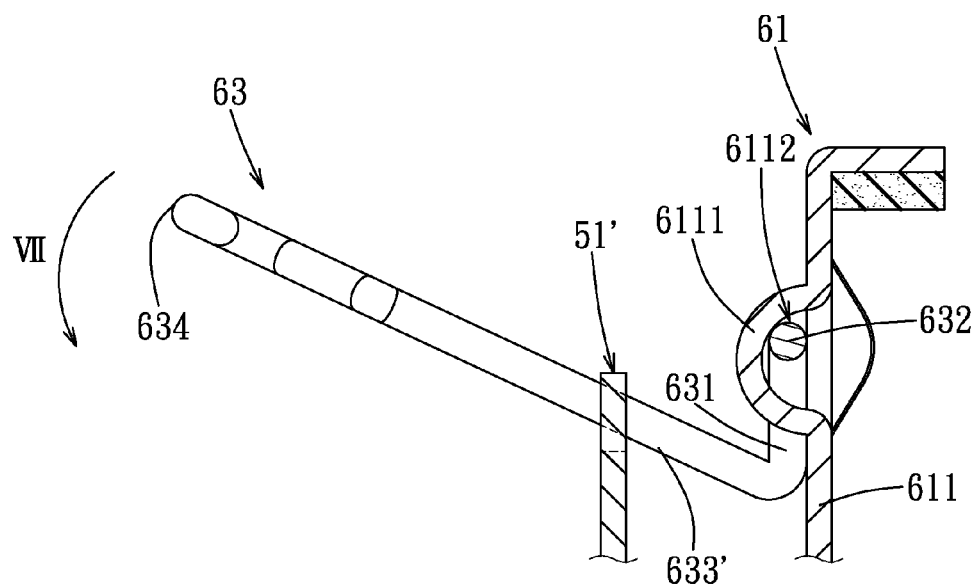
FIG. 20 is a sectional view of the second embodiment, illustrating an abutment rod of the locking member abutting against a front stop plate of the positioning frame.

Referring to FIGS. 18 to 20, the press rod 634 of the locking member 63 is then pressed downward so as to rotate the locking member 63 in the direction of an arrow (VII). Since a top end of the hook body 512 has an upper inclined surface 515, when the inclined rod 633' is in contact with the upper inclined surface 515 of the hook body 512, the inclined rod 633' is pushed by the upper inclined surface 515 to move in the direction of an arrow (VI) bringing therealong the pivot rod 632 connected thereto. During movement of the inclined rod 633', the press rod 634 is bent and deformed to store a restoring force, and the inclined rod 633' gradually approaches the inclined rod 633. When the inclined rod 633' passes over the upper inclined surface 515, the two abutment rods 631 of the locking member 63 abut against the front stop plate 611 of the positioning frame 61 so that the pivot rods 632 cannot continue to rotate relative to the retaining members 6111.

Figure 21:
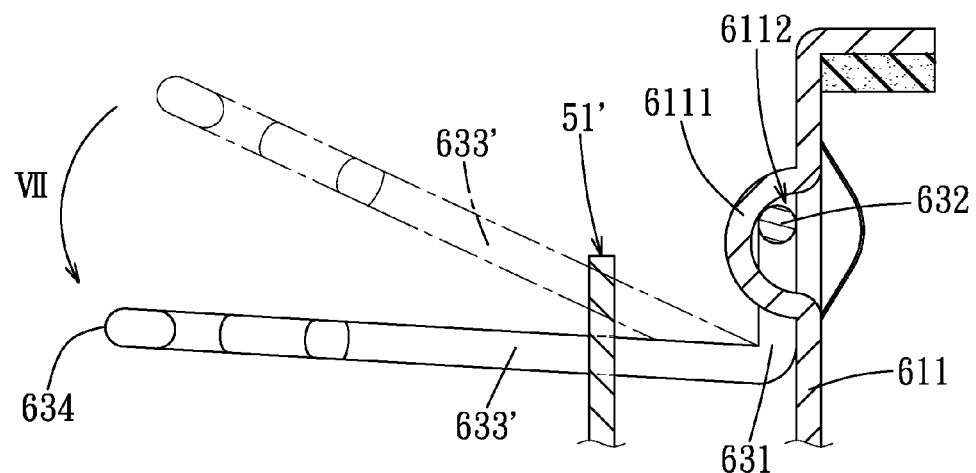
FIG. 21 is a view similar to FIG. 20, but illustrating how the inclined rod is bent relative to the abutment rod by pressing a press rod of the locking member along an arrow (VII)
Figure 22:
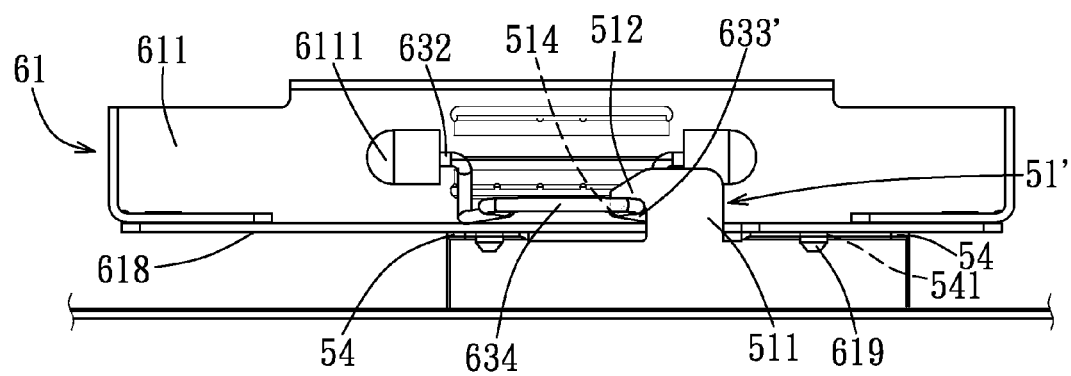
FIG. 22 is a view similar to FIG. 17, but illustrating the inclined rod engaged to a hook portion of the hook body.
Figure 23:
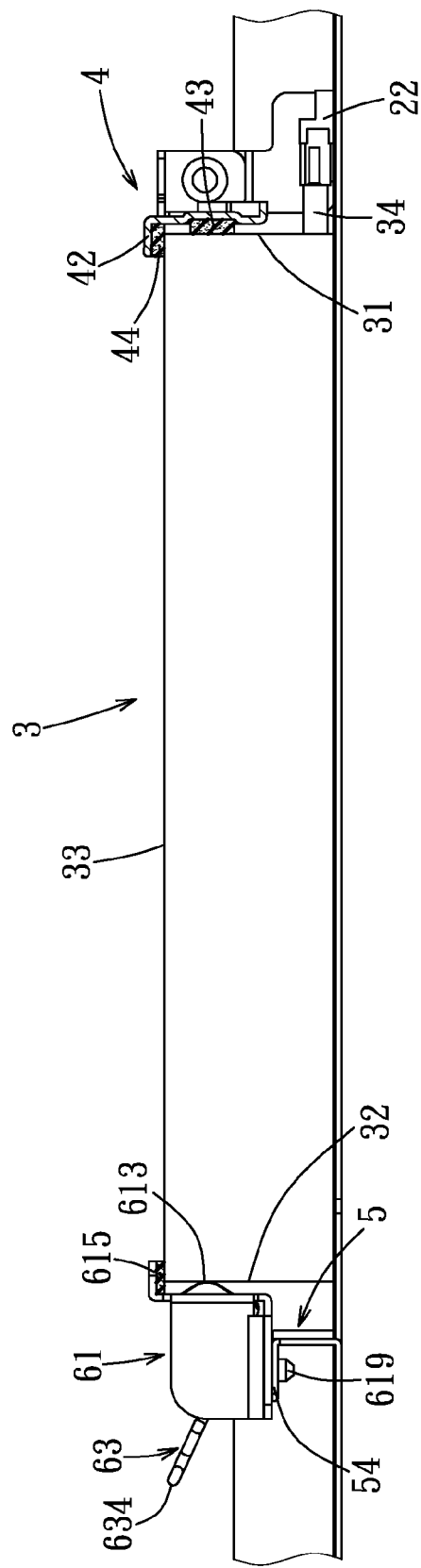
FIG. 23 is a sectional view of the second embodiment, illustrating how an electronic component is fixed to a housing of the electronic device through engagement of the positioning frame with the front frame.

Referring to FIGS. 21 to 23, as the press rod 634 is continuously pressed downward along the arrow (VII), because the abutment rods 631 abut against the front stop plate 611, the press rod 634 will urge the inclined rods 633, 633' to bend and deform relative to the respective abutment rods 631 to store a restoring force. When the inclined rod 633' is moved down below the hook portion 514 of the hook body 512, the press rod 634 is released, and through the restoring force of the press rod 634, the inclined rod 633' is driven to move along a direction opposite to the arrow (VI) (see FIG. 19), so that the inclined rod 633' can move past and engage the hook portion 514. Simultaneously, through its own restoring force, the inclined rod 633' moves upward to engage the hook portion 514 of the hook body 512 and be disposed in a locking position. At this time, the positioning frame 61 is fixed onto the front frame 5.

To detach the positioning frame 61 from the front frame 5, the press rod 634 is first pressed downward so as to bend and deform the inclined rods 633, 633' relative to the abutments rods 631. As the inclined rod 633' moves below the hook portion 514 of the hook body 512, the inclined rod 633' is pressed along the arrow (VI) (see FIG. 19) to move past the hook portion 514. Finally, the press rod 634 is pushed upward along the arrow (V) (see FIG. 16) to release a locked state between the locking member 63 and the retaining portion 51. At this time, the locking mechanism 6 is moved upward along the disassembly direction (IV) to detach the positioning frame 61 from the front frame 5. It should be noted that through the design of the hook portion 514 of the hook body 512, to disengage the locking member 63 from the hook body 512 of the retaining portion 51', the press rod 634 must first be pressed downwardly to move the inclined rod 633' below the hook portion 514, after which the inclined rod 633' is pressed to move past the hook portion 514 and be detached from the hook body 512. The aforesaid design ensures that the inclined rod 633' can be stably engaged to the hook portion 514 and can be prevented from detaching from the hook body 512 due to vibration of the housing 1.

Figure 24:
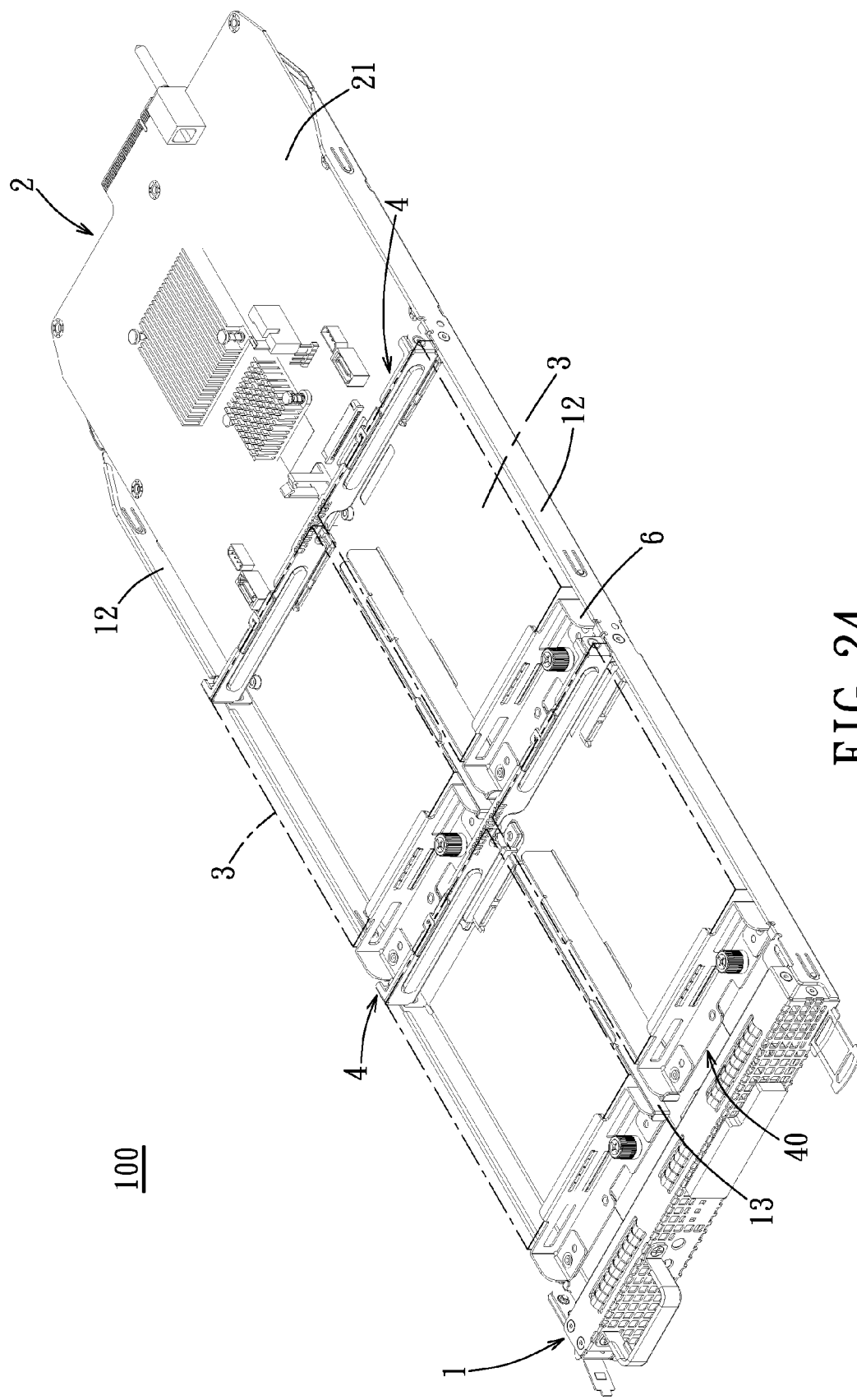
FIG. 24 is a perspective view of the electronic equipment incorporating a locking device according to the third embodiment of the present disclosure.
Figure 25:
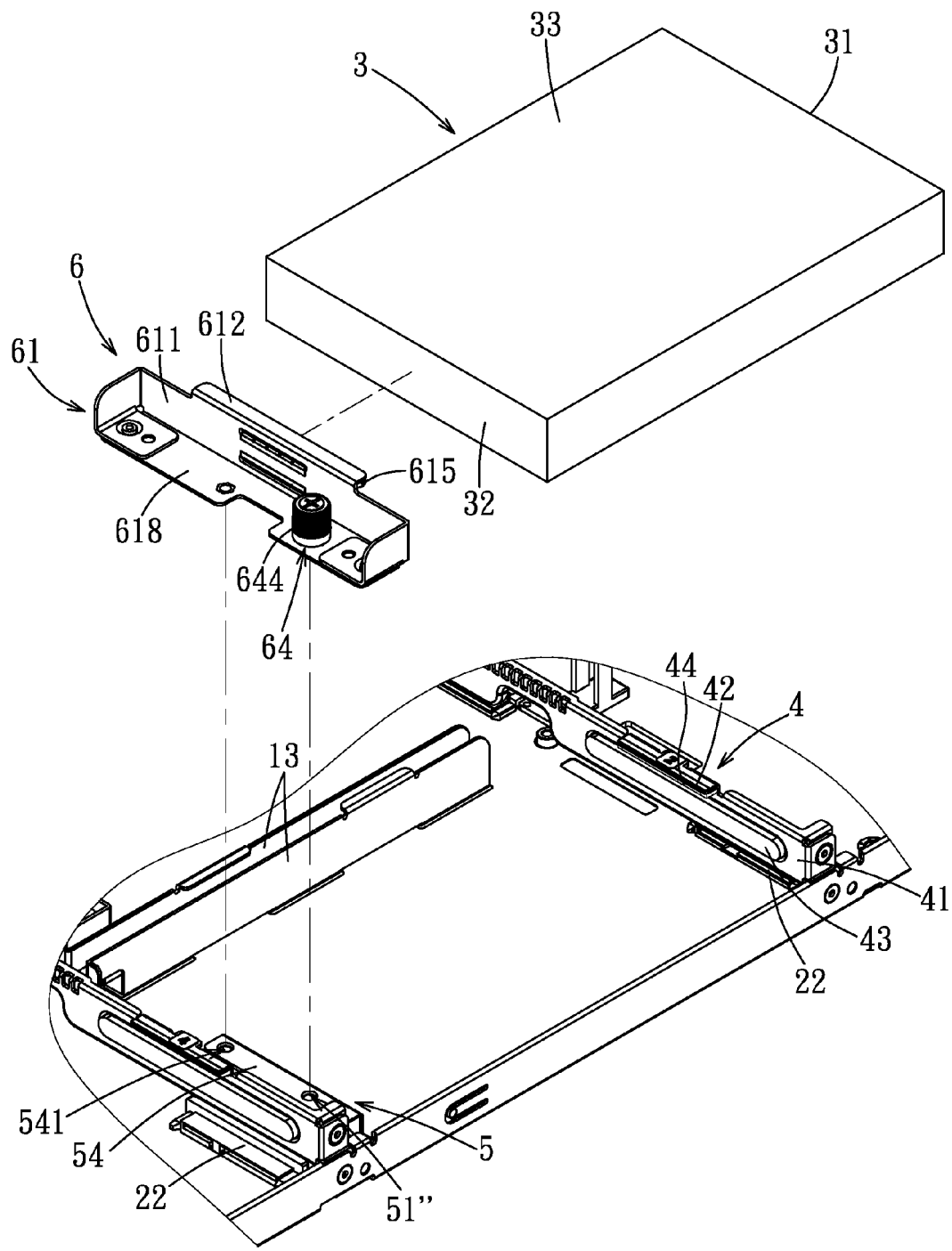
FIG. 25 is a fragmentary partly exploded perspective view of FIG. 24.

Referring to FIGS. 24 and 25, the third embodiment of the locking device 40 according to the present disclosure is shown to be substantially similar to the first embodiment in overall structure, and differs only in the structural design of the front frame 5 and the locking mechanism 6.

Figure 26:
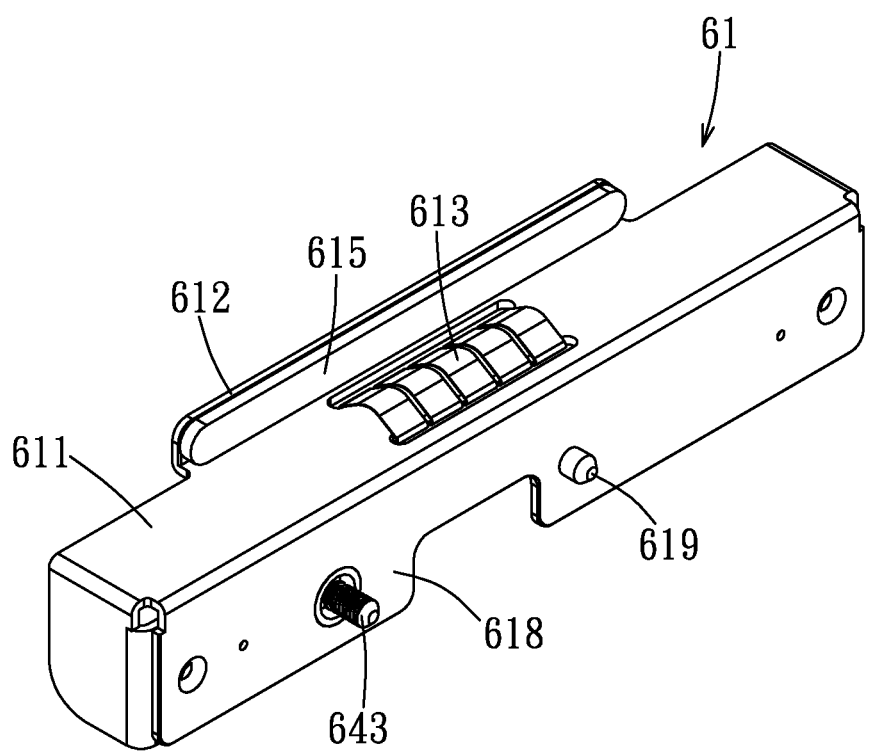
FIG. 26 is a perspective view of a locking mechanism of the third embodiment.
Figure 27:
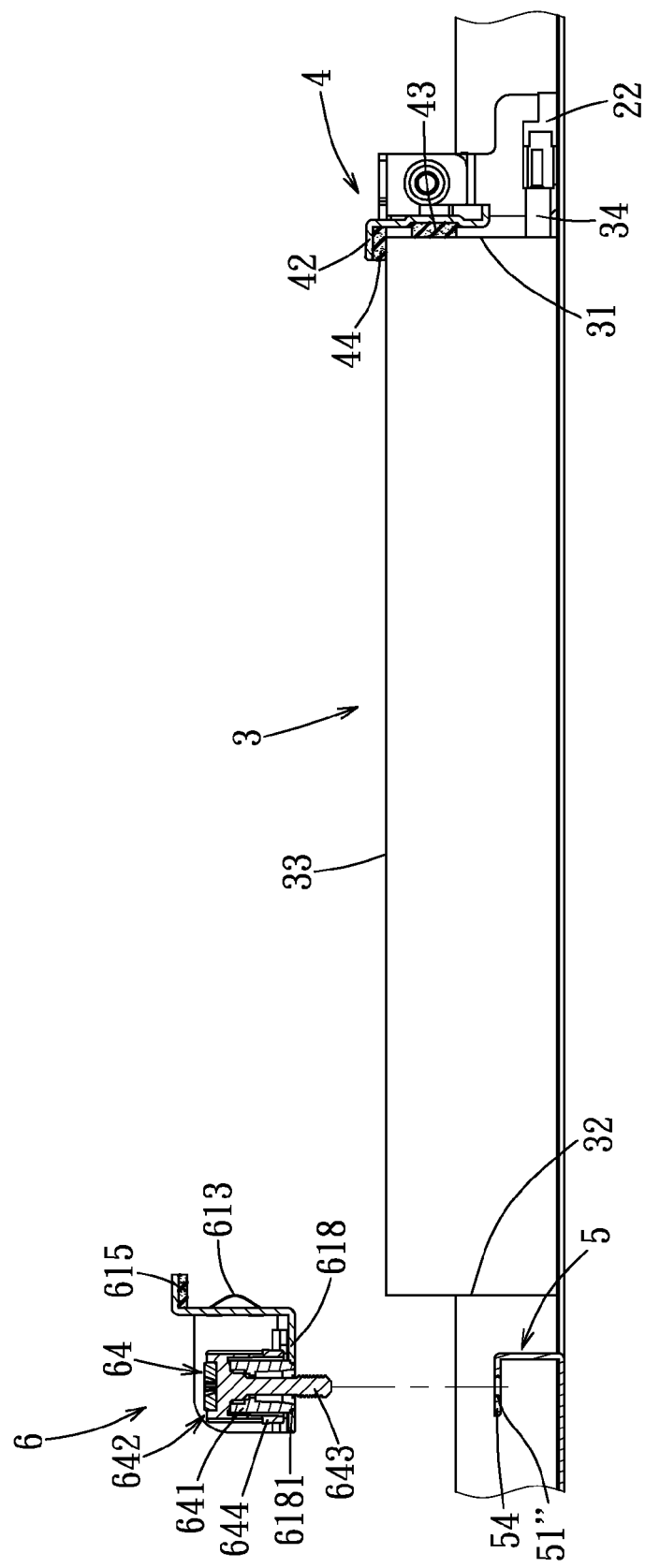
FIG. 27 is a sectional view of the third embodiment, illustrating the locking mechanism being moved towards a front frame of the locking device.

As shown in FIGS. 25 to 27, in this embodiment, the number of the supporting flat plate 54 and the positioning hole 541 is one, respectively, and the retaining portion 51" is configured as a threaded hole that is formed in the supporting flat plate 54. The positioning frame includes one positioning pin 619. The locking member 64 includes a hollow fixed sleeve 641 fixed to the lower plate 618, and a locking bolt 642 that extends through and that is rotatable relative to the fixed sleeve 641. The fixed sleeve 641 is fixed to a mounting hole 6181 of the lower plate 618 through a tight-fitting manner. The locking bolt 642 includes a rotary sleeve 644 rotatably sleeved on an outer periphery of the fixed sleeve 641, and a threaded rod section 643 that extends from an inner surface of the rotary sleeve 644 and that extends through the fixed sleeve 641. The threaded rod section 643 partially extends through the lower plate 618 for threadedly engaging the retaining portion 51".

Figure 28:
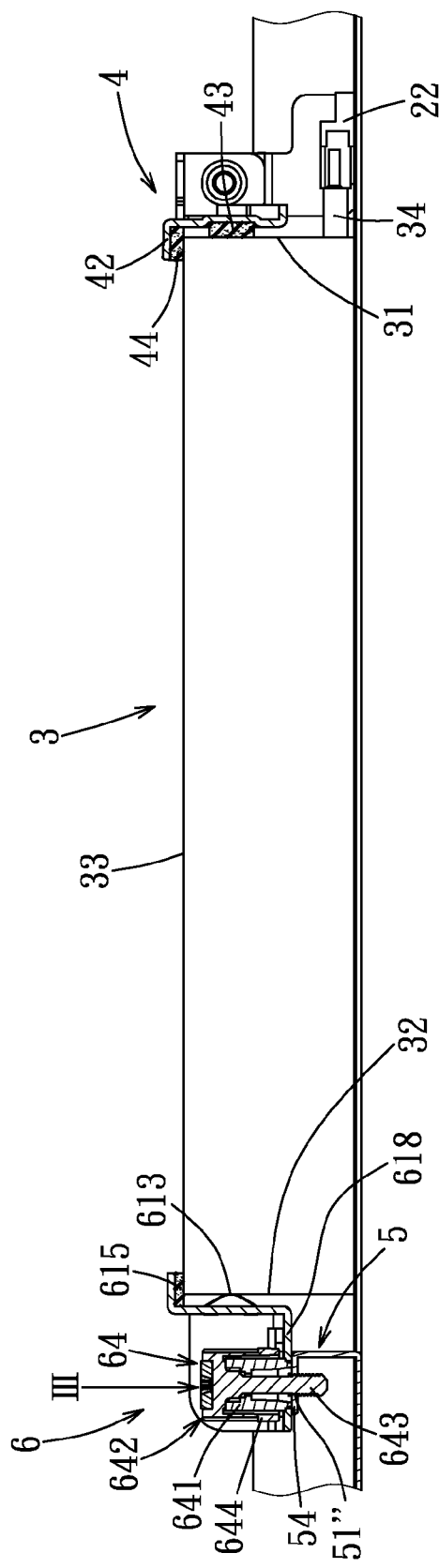
FIG. 28 is a view similar to FIG. 27, but illustrating the locking mechanism engaged to the front frame.
Figure 29:
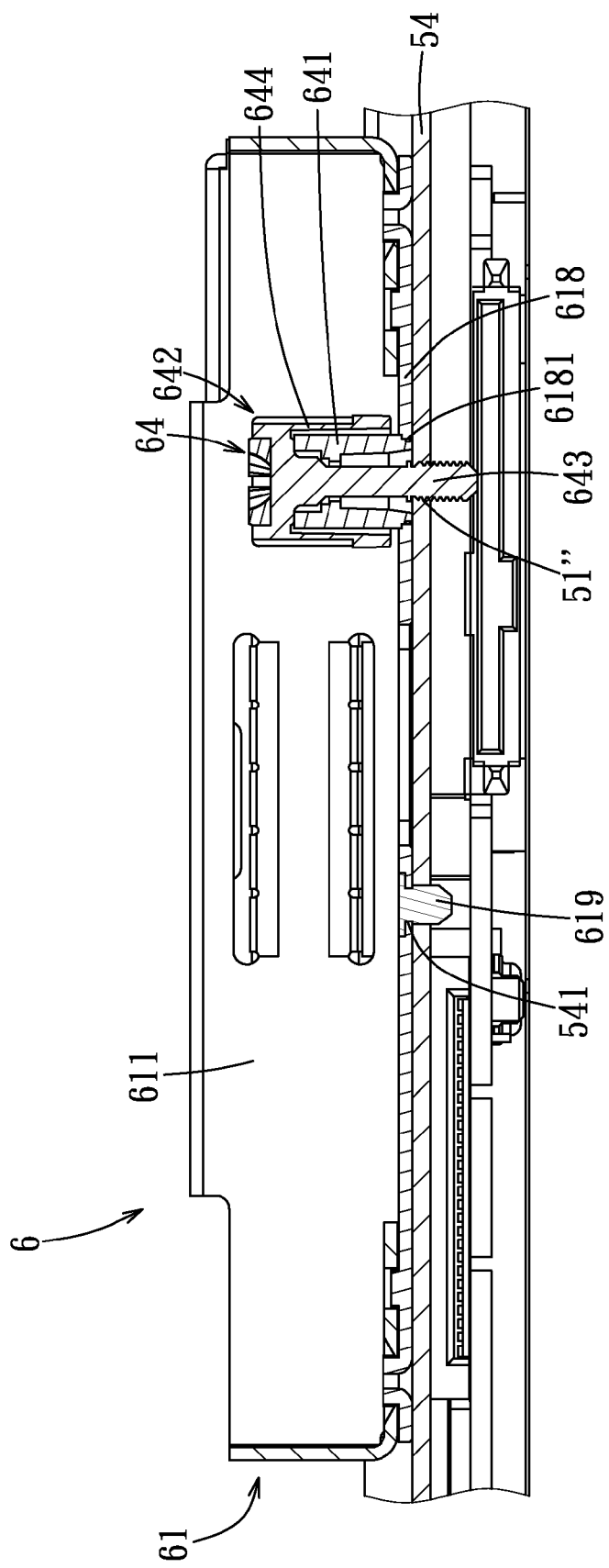
FIG. 29 is an enlarged fragmentary sectional view of the third embodiment, illustrating a positioning pin engaged to a positioning hole and a threaded section of a locking bolt engaged to a retaining portion of the front frame.

As shown in FIGS. 27, 28 and 29, to secure the positioning frame 61 on the front frame 5, the locking mechanism 6 is moved along the assembly direction (III) so as to engage the positioning pins 619 of the positioning frame 61 with the respective positioning holes 541 and to align the threaded rod section 643 of the locking bolt 642 with the retaining portion 51". The rotary sleeve 644 is rotated clockwise so as to drive the threaded rod section 643 to rotate therealong and engage threadedly the retaining portion 51" and so as to drive the lower plate 618 of the positioning frame 61 to abut against the supporting flat plate 54. The positioning frame 61 is secured onto the front frame 5 at this time.

To detach the positioning frame 61 from the front frame 5, the rotary sleeve 644 is rotated counterclockwise to drive the threaded rod section 643 to rotate reversely so as to disengage from the retaining portion 51". The locking mechanism 6 is then moved along the disassembly direction (IV) (see FIG. 11) to remove the positioning frame 61 from the front frame 5.

Figure 30:
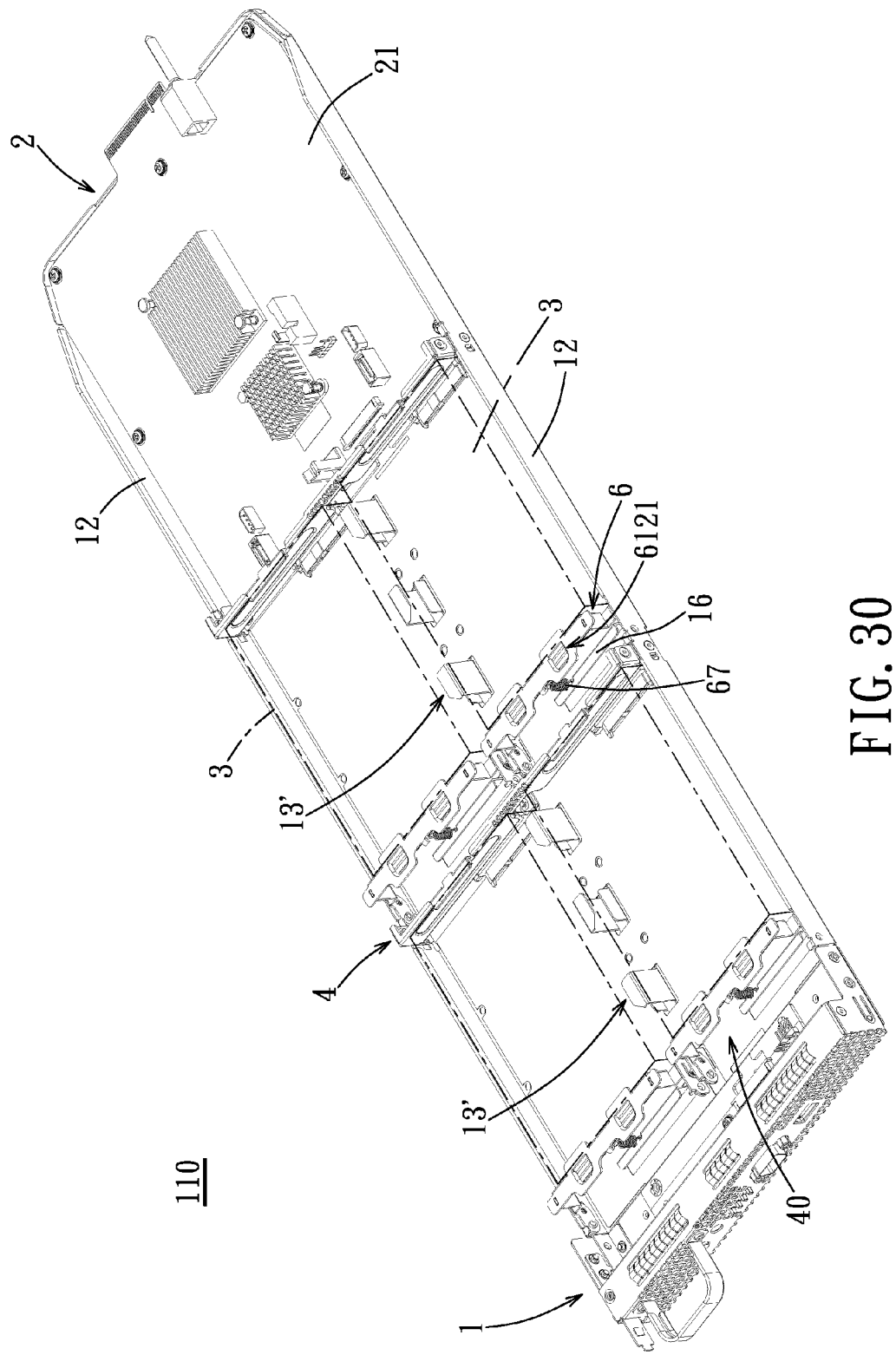
FIG. 30 is a perspective view of an electronic equipment incorporating a locking device according to the fourth embodiment of the present disclosure.
Figure 31:
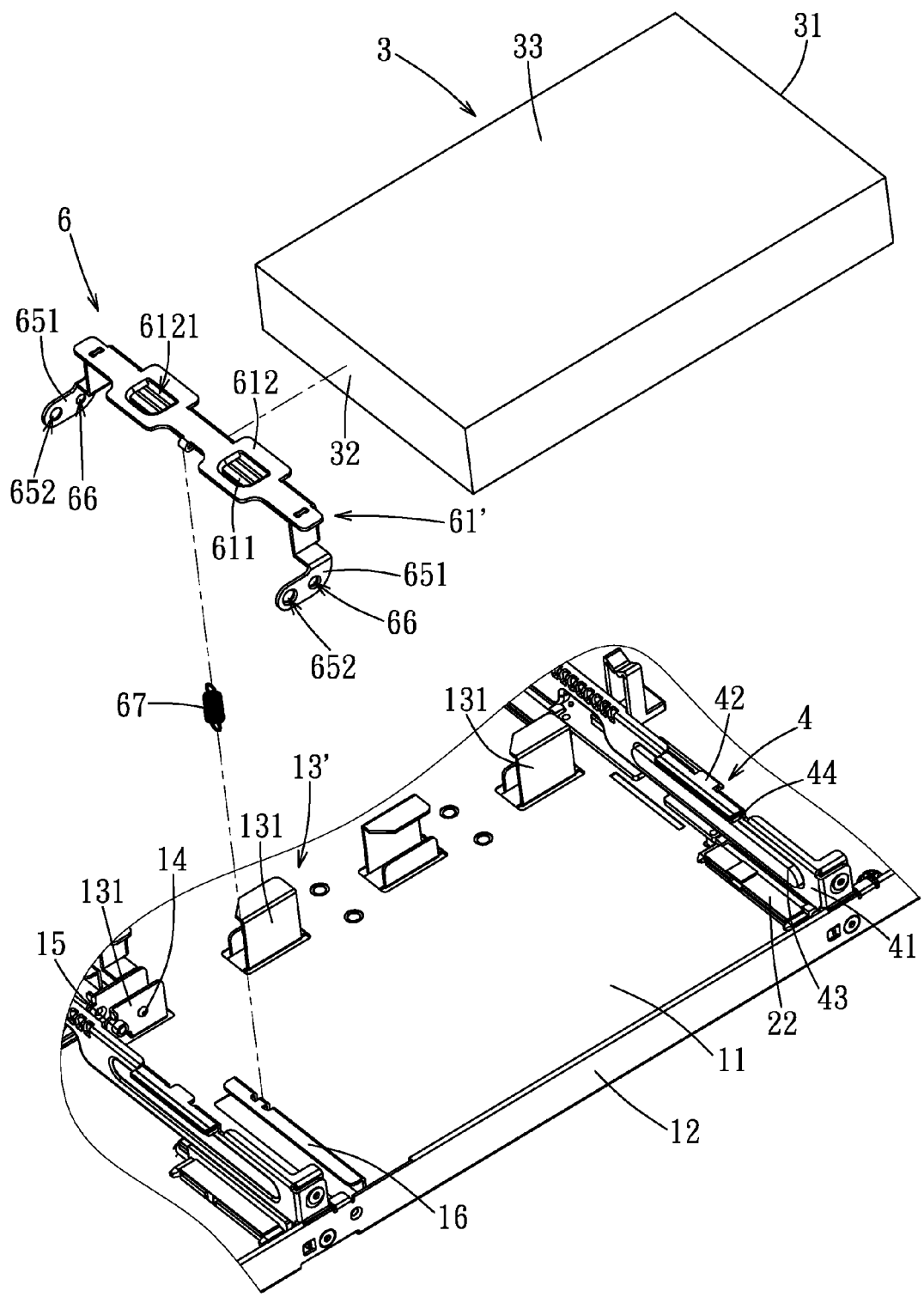
FIG. 31 is a fragmentary partly exploded perspective view of FIG. 30.

Referring to FIGS. 30 and 31, the fourth embodiment of the locking device 40 according to the present disclosure is adapted to be applied to an electronic equipment 110. The overall structure of the electronic equipment 110 is substantially similar to that described in the first embodiment, and differs only in the structural designs of the housing 1 of the electronic equipment 110 and the locking mechanism 6 of the locking device 40.

Figure 32:
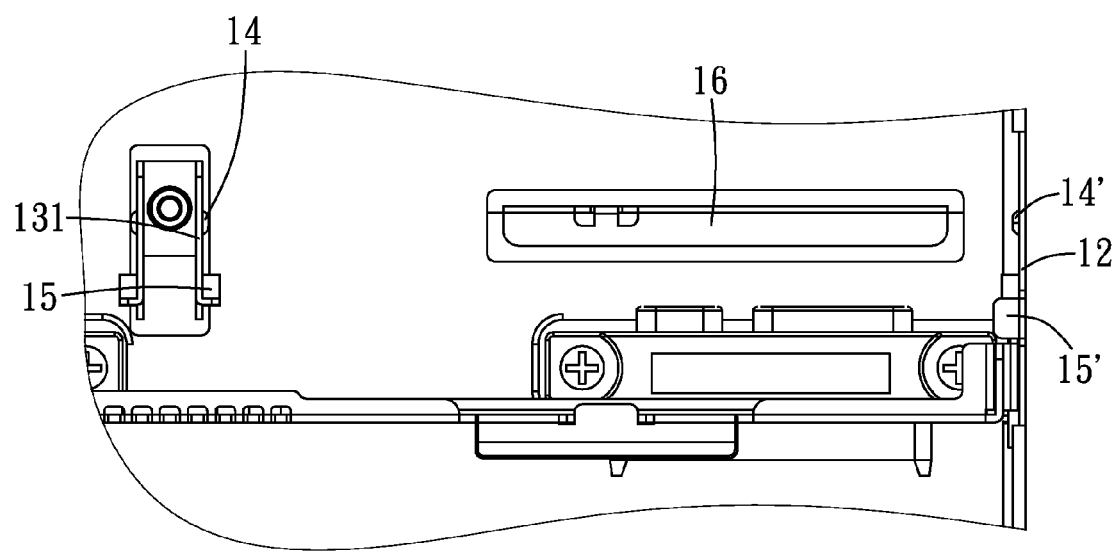
FIG. 32 is a fragmentary schematic top view of the fourth embodiment, illustrating each of a guide plate portion and a side plate being provided with a positioning part and a pivot.

As shown in FIGS. 31 and 32, in this embodiment, each guide plate 13' includes a plurality of guide plate portions 131 spaced apart from each another in a front-rear direction. One of the guide plate portions 131 that is located on the frontmost side of the housing 1 is provided with a positioning part 14, and a pivot 15' that is disposed in front of and spaced apart from the positioning part 14. Each side plate 12 is provided with another positioning part 14' that corresponds in position to and that aligns with the positioning part 14 of the guide plate portion 131, and another pivot 15' that corresponds in position to and that aligns with the pivot 15 of the guide plate portion 131. The positioning frame 61' includes two pivot plates 651 connected to the left and right sides of the front stop plate 611. Each of the pivot plates 651 is formed with a pivot hole 652 for pivot connection with a corresponding pivot 15, 15', so that the positioning frame 61' can rotate relative to the guide plate portion 131 and the side plate 12 about the pivot 15. Each locking mechanism 6 includes two locking members 66 each disposed on a respective pivot plate 651 and located spaced apart from and rearwardly of the pivot hole 652. Each locking member 66 is releaseably secured to the respective positioning part 14, 14' so that the positioning frame 61' can be position at a fixing position (see FIG. 30), where the positioning frame 61' fixes a front side of the electronic component 3. The positioning part 14 of this embodiment is configured as a semicircular projection, and the locking member 66 is configured as an engaging hole for engaging the semicircular projection. It should be noted that the number of the positioning part 14, 14' and the locking member 66 may be one, respectively, but is not limited thereto.

Figure 33:
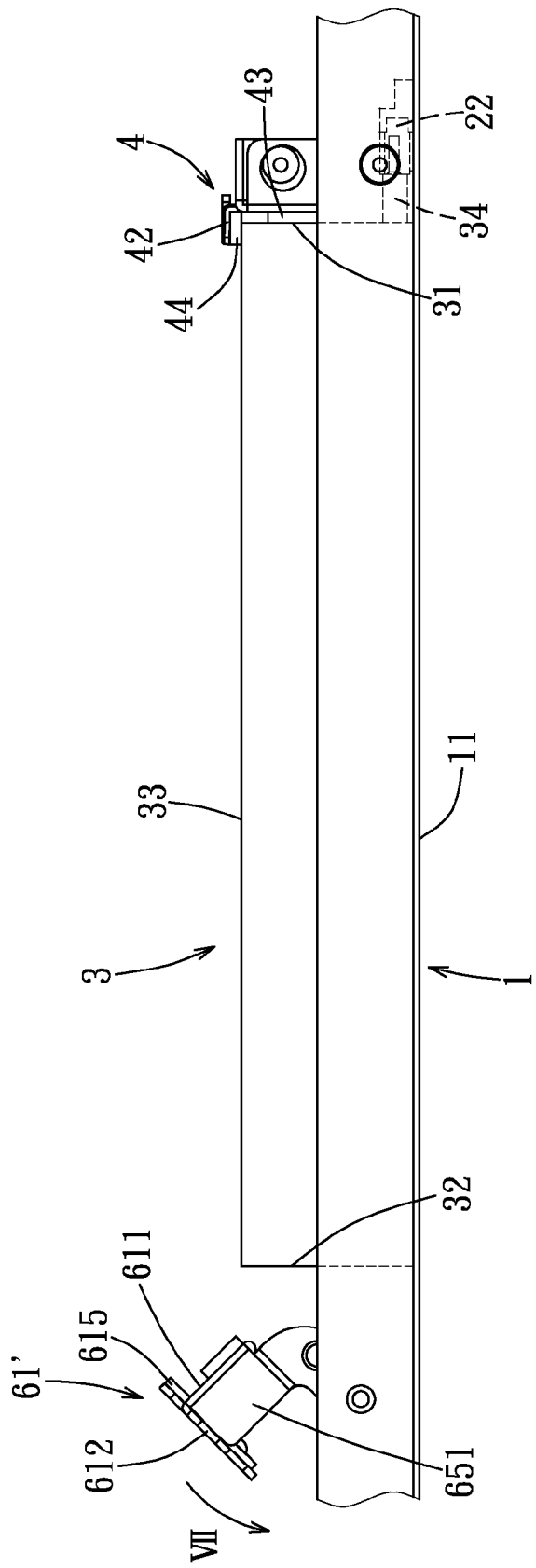
FIG. 33 is a schematic side view of the fourth embodiment, illustrating a positioning frame being rotated to an open position.

To assemble the electronic component 3 in the housing 1, the positioning frame 61' is first rotated along the arrow (VII) to an open position, as shown in FIG. 33, after which the electronic component 3 is downwardly placed onto the bottom plate 11 such that the left and right sides of the electronic component 3 respectively abut against the guide plate 13' and the side plate 12. The electronic component 3 is then pushed backward, and is guided by the guide plate 13' and the side plate 12 to slide backward, so that the electrical connector 34 of the electronic component 3 can be accurately connected to the respective electrical connector 22. The rear buffer pad 43 and the first buffer pad 44 of the rear stop frame 4 respectively abut against the rear end face 31 and the top face 33 of the electronic component 3 at this time.

Figure 34:
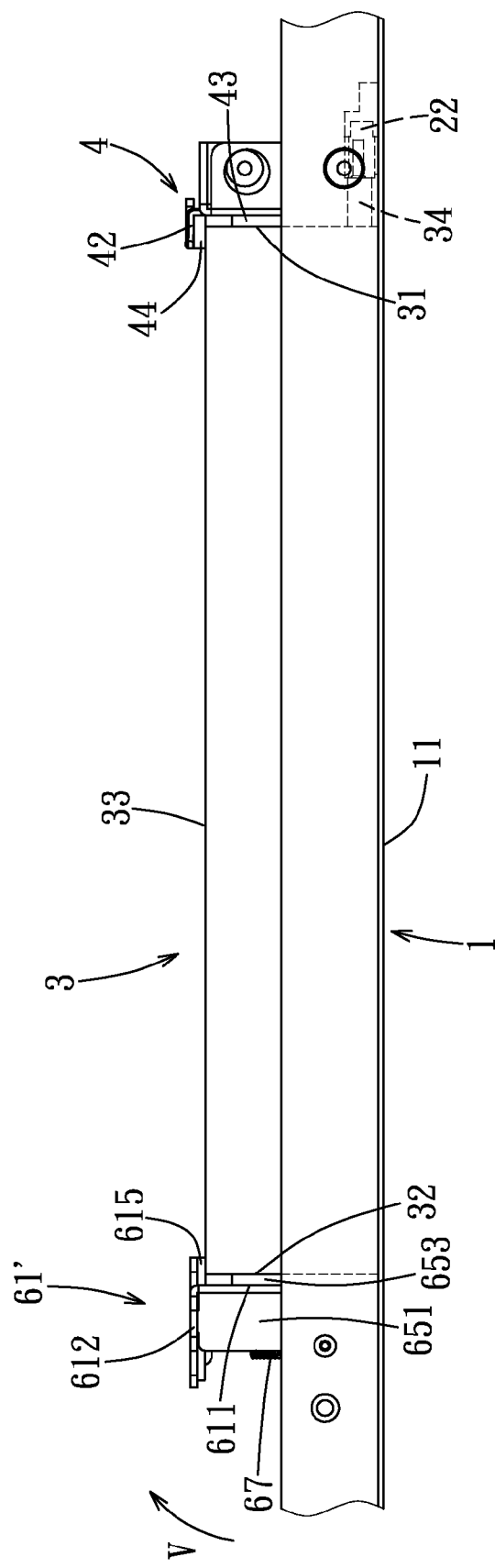
FIG. 34 is a view similar to FIG. 33, but with the positioning frame being rotated to a fixing position.
Figure 35:
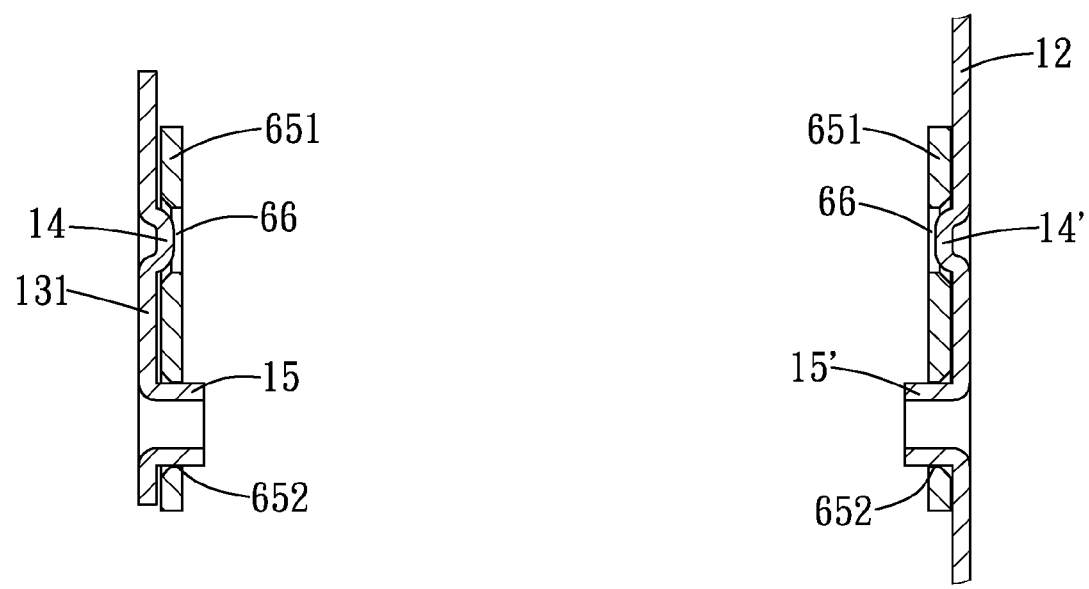
FIG. 35 is a sectional view, illustrating the pivot of the guide plate portion and the pivot of the side plate being respectively engaged to pivot holes in pivot plates of two locking members.

Referring to FIGS. 34 and 35, the positioning frame 61' is then rotated along the arrow (V). When the positioning parts 14, 14' are respectively engaged to the locking members 66, the positioning frame 61' is positioned in the fixing position. At this time, a front buffer pad 653 that is adhered to the front stop plate 611 of the positioning frame 61' abuts against the front end face 32 of the electronic component 3, and the second buffer pad 615 abuts against the top face 33 of the electronic component 3. Therefore, the positioning frame 61' stably secures the electronic component 3 to the housing 1.

With reference to FIGS. 31, 34 and 35, since the positioning part 14, 14' and the locking member 66 are interengaged through the semicircular projection and the engaging hole, an assembly tolerance is likely to exist therebetween. In order to eliminate the impact of the aforementioned assembly tolerance which can prevent the front buffer pad 653 and the second buffer pad 615 from tightly abutting against the electronic component 3, in this embodiment, the locking mechanism 6 further includes a spring member 67 which is a tension spring. The spring member 67 has a top end connected to the second top stop plate 612 of the positioning frame 61', and a bottom end connected to a bent plate 16 that is disposed on the bottom plate 11 of the housing 1. The spring member 67 is used for downwardly biasing the positioning frame 61' so that the front buffer pad 653 and the second buffer pad 615 can tightly and respectively abut against the front end face 32 and the top face 33 of the electronic component 3. In addition, when the locking device 40 fixes an electronic component 3 made by a different manufacturer with the same specification, if the electronic component 3 is lower in height and shorter in length, through the aforesaid design of the spring member 67, the front buffer pad 653 and the second buffer pad 615 can be ensured of tightly abutting against the front end face 32 and the top face 33 of the electronic component 3, thereby preventing the electronic component 3 from rocking.

With reference to FIGS. 31, 33 and 35, to detach the electronic component 3 from the housing 1, a user inserts his/her fingers into two openings 6121 in the second top stop plate 612 and clasps the second top stop plate 612, after which the positioning frame 61' is rotated along the arrow (VII) so that the locking members 66 are detached from the respective positioning parts 14, 14', thereby releasing the positioning frame 61' from being locked to the guide plate portion 131 and the side plate 12. The positioning frame 61' can then be rotated to the open position shown in FIG. 33. Subsequently, the electronic component 3 is moved forwardly to detach the electronic connector 34 from the respective electrical connector 22, and is removed from the housing 1 for repair or replacement.

Figure 36:
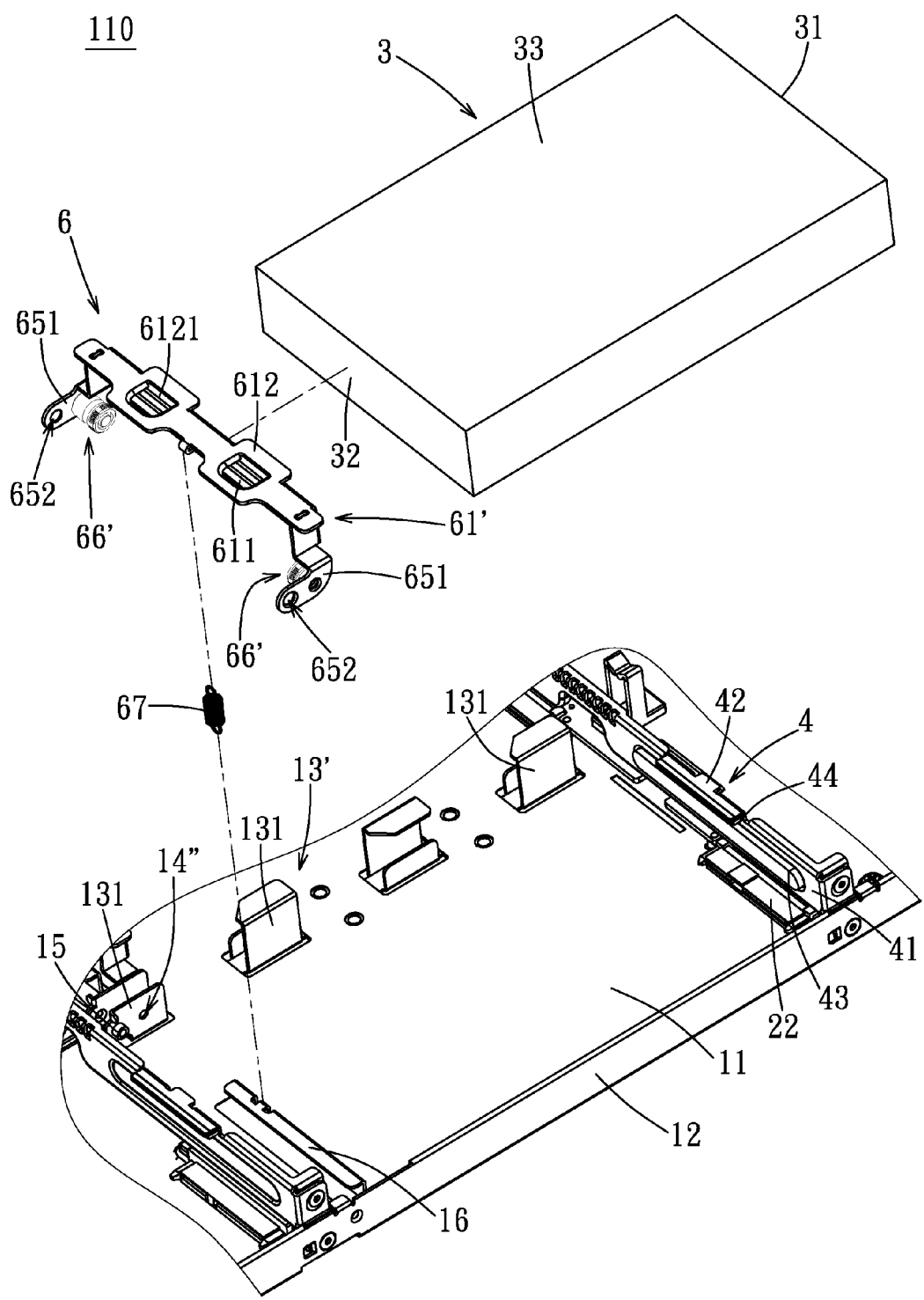
FIG. 36 is a fragmentary partly exploded perspective view of the electronic equipment incorporating a locking device according to the fifth embodiment of the present disclosure.

Referring to FIG. 36, the fifth embodiment of the locking device 40 according to the present disclosure is shown to be substantially similar to the fourth embodiment in overall structure. The difference resides in the structural design of each locking member 66' of the locking mechanism 6.

Figure 37:
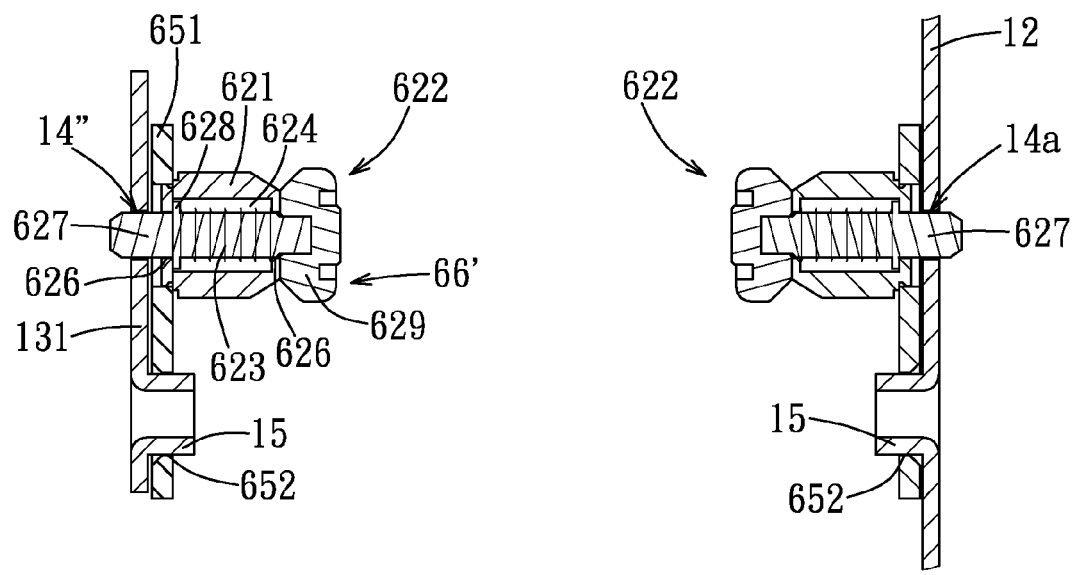
FIG. 37 is a sectional view of the fifth embodiment, illustrating locking bolts of two locking members being respectively engaged to positioning parts of a guide plate portion and a side plate.

As shown in FIGS. 36 and 37, in this embodiment, the positioning part 14", (14a) of the frontmost guide plate portion 131 and the side plate 12 is configured as an engaging hole, and the structural design of each locking member 66' is shown to be substantially similar to the locking member 62 of the first embodiment. Each locking member 66' includes a casing 621 fixed to a respective pivot plate 651, a locking bolt 622 that extends through the casing 621 and that releasably engages the positioning part 14", and a biasing spring 623 disposed in the casing 621 for biasing each locking bolt 622 toward the respective positioning part 14", (14a).

As described in the first embodiment, the casing 621 is formed with a passage hole 624, and the passage hole 624 has a large diameter hole portion 625, and two small diameter hole portions 626 each with a diameter smaller than that of the large diameter hole portion 625. In addition, each locking bolt 622 includes a bolt rod 627 partially projecting out of the casing 621, an annular flange 628 disposed in the large diameter hole portion 625 of the passage hole 624, and a bolt head 629 that is disposed on an end of the bolt rod 627 which is distal from the annular flange 628 and that is located on an outer side of the casing 621. The biasing spring 623 is a compression spring having two ends respectively abutting against the annular flange 628 and the casing 621. Through the biasing action of the biasing spring 623 on the annular flange 628, each locking bolt 622 can be maintained in the first position, where the bolt rod 627 projects out of the casing 621 and engages the respective positioning part 14", (14a). The positioning frame 61' is positioned in a fixing position at this time.

Figure 38:
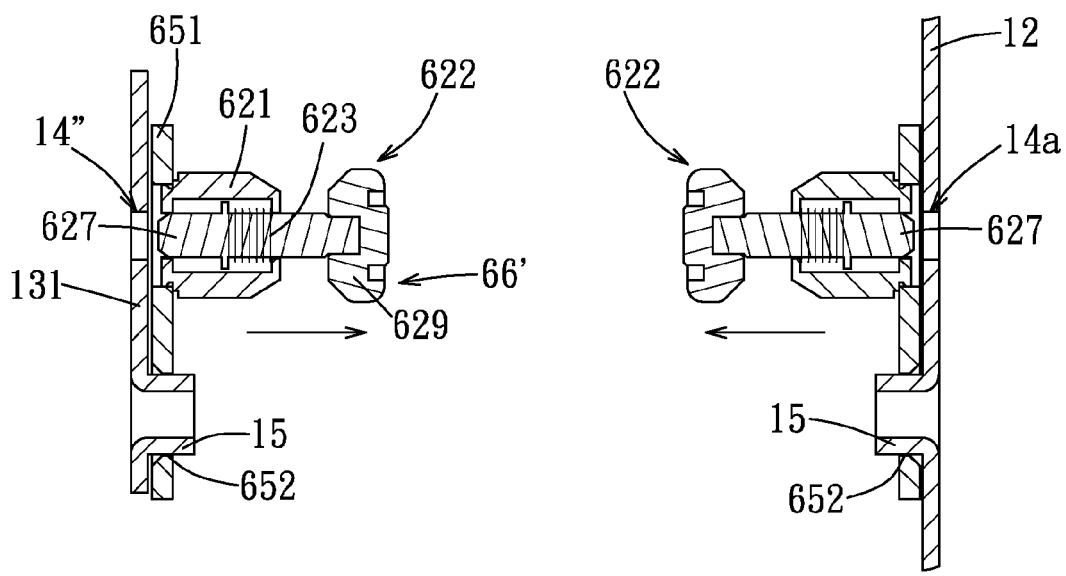
FIG. 38 is a view similar to FIG. 37, but with the locking bolts of the locking members being moved away from the respective positioning parts.

Referring to FIG. 38, to disengage the locking member 66' from the guide plate portion 131 or the side plate 12, the bolt head 629 of the locking bolt 622 is gripped first and then pulled along the direction of an arrow to move the bolt rod 627 away from the positioning part 14", (14a). The positioning frame 61' can be rotated at this time.

Figure 39:
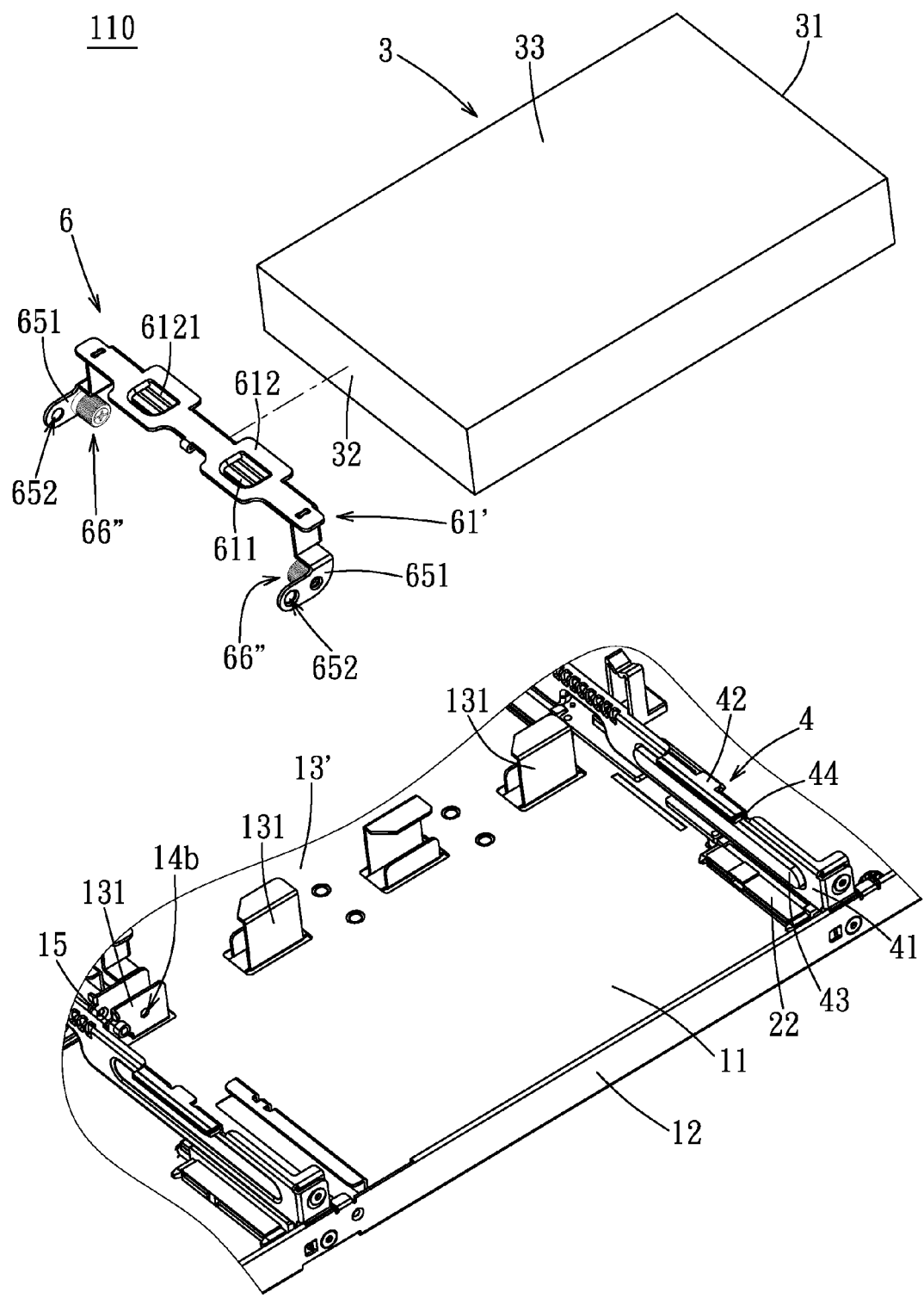
FIG. 39 is a fragmentary partly exploded perspective view of the electronic equipment incorporating a locking device according to the sixth embodiment of the present disclosure.

Referring to FIG. 39, the sixth embodiment of the locking device 40 according to the present disclosure is shown to be substantially similar to the fourth embodiment in overall structure, and differs only in the structural design of each locking member 66". In this embodiment, the structural design of each locking member 66" is similar to that described in the third embodiment.

Figure 40:
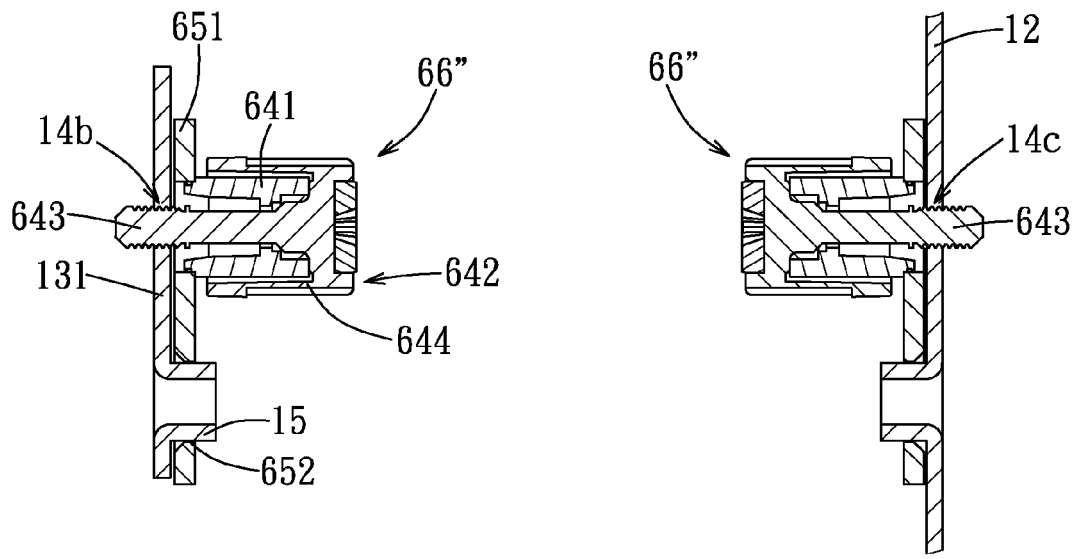
FIG. 40 is a sectional view of the sixth embodiment, illustrating locking bolts of two locking members being respectively engaged to positioning parts of a guide plate portion and a side plate.

As shown in FIGS. 39 and 40, in this embodiment, the positioning part (14a, 14b) of each of the frontmost guide plate portion 131 and the side plate 12 is configured as a threaded hole, and each locking member 66" includes a fixed sleeve 641 fixed to a respective pivot plate 651, and a locking bolt 642 that extends through and that is rotatable relative to the fixed sleeve 641. The locking bolt 642 of each locking member 66" extends out of the respective pivot plate 651 and engages threadedly the respective positioning part (14a, 14b). The locking bolt 642 of each locking member 66" includes a rotary sleeve 644 rotatably sleeved on an outer periphery of the fixed sleeve 641, and a threaded rod section 643 that extends from an inner surface of the rotary sleeve 644 and that extends through the fixed sleeve 641 for threadedly engaging the respective positioning part (14a, 14b). When the threaded rod section 643 of the locking bolt 642 is threadedly engaged to the respective positioning part (14a, 14b), the positioning frame 61' is positioned in the fixing position.

Figure 41:
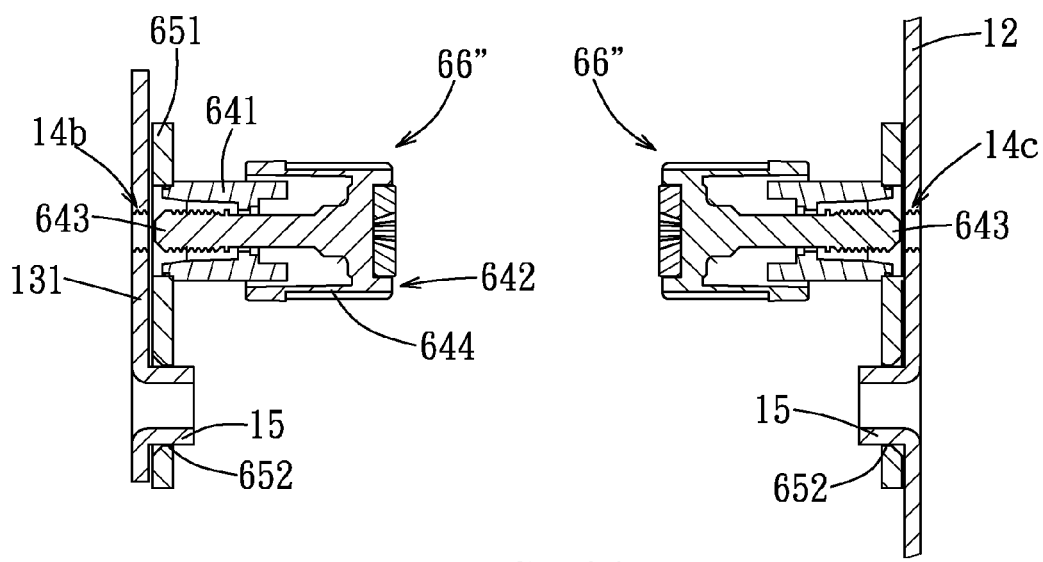
FIG. 41 is a view similar to FIG. 40, but with the locking bolts of the locking members being moved away from the respective positioning parts.

Referring to FIG. 41, to disengage the locking member 64 from the guide plate portion 131 or the side plate 12, the rotary sleeve 644 is rotated counterclockwise to drive the threaded rod section 643 to rotate reversely so as to move the threaded rod section 643 away from the respective positioning part (14a, 14b). The positioning frame 61' can be rotated at this time.

In summary, through the simple structural design of the locking device 40 in each embodiment, the locking device can quickly fix an electronic component to the housing 1 or disassemble the same from the housing 1 for repair or replacement while dispensing with the need of using a bracket or an auxiliary tool. The entire assembly and disassembly processes are very easy, which leads to reduction in working hours of assembly or disassembly as well as the associated manufacturing cost. Moreover, since each electronic component 3 can be fixed in the housing 1 by using the locking device 40 and dispensing with the need of a bracket, a space to be occupied by the bracket in the housing 1 can be reduced, so that the housing 1 can accommodate more electronic components 3 under a limited amount of space. Therefore, the objects of this disclosure are served.

While the present disclosure has been described in connection with what are considered the most practical embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A locking device suitable for fixing an electronic component to a housing, said locking device comprising:
   a rear stop frame adapted to be disposed on the housing for fixing a rear side of the electronic component;
   a front frame adapted to be disposed on the housing, said front frame being spaced apart from and in front of said rear stop frame, and including a retaining portion and at least one supporting flat plate, each supporting flat plate being formed with a positioning hole; and
   a locking mechanism including a positioning frame for fixing a front side of the electronic component, and a locking member disposed on said positioning frame and releasably engaged to said retaining portion, said locking member being engaged to said retaining portion to fix said positioning frame on said front frame, said positioning frame including a lower plate that abuts against said supporting flat plate, and at least one positioning pin that protrudes from said lower plate and that engages said positioning hole.

2. The locking device as claimed in claim 1, wherein said rear stop frame includes a rear stop plate for blocking a rear end face of the electronic component, and said positioning frame includes a front stop plate for blocking a front end face of the electronic component.

3. The locking device as claimed in claim 2, wherein said rear stop frame further includes a rear buffer pad disposed on said rear stop plate for abutting against the rear end face of the electronic component, said positioning frame further including an elastic packing member disposed on said front stop plate for abutting against the front end face of the electronic component, said elastic packing member being adapted to bias the electronic component toward said rear buffer pad.

4. The locking device as claimed in claim 2, wherein said rear stop frame further includes a first top stop plate connected to a top end of said rear stop plate, said positioning frame further including a second top stop plate connected to a top end of said front stop plate, said first and second top stop plates being adapted to block a top face of the electronic component.

5. The locking device as claimed in claim 4, wherein said rear stop frame further includes a first buffer pad disposed on a bottom end of said first top stop plate, and said positioning frame further includes a second buffer pad disposed on a bottom end of said second top stop plate.

6. The locking device as claimed in claim 2, wherein said front frame further includes an upright plate, said retaining portion being configured as an engaging hole that is formed in said upright plate, said locking member including a casing fixed to said positioning frame, a locking bolt that extends through said casing and that releasably engages said retaining portion, and a biasing spring disposed in said casing and biasing said locking bolt toward a first horizontal direction so as to engage said locking bolt with said retaining portion.

7. The locking device as claimed in claim 6, wherein said upright plate includes an upright plate portion, and an inclined plate portion extending obliquely from a top end of said upright plate portion, said inclined plate portion having an inclined guide surface to contact and move said locking bolt along a second horizontal direction that is opposite to the first horizontal direction.

8. The locking device as claimed in claim 6, wherein said casing defines a passage hole, said locking bolt including a bolt rod that extends through said passage hole and that partially projects out of said casing, an annular flange that extends outwardly and radially from an outer peripheral surface of said bolt rod and that is disposed in said passage hole, and a bolt head disposed on an end of said bolt rod and that is located on an outer side of said casing, said biasing spring being sleeved on said bolt rod and abutting between said annular flange and said casing.

9. The locking device as claimed in claim 6, wherein said lower plate is connected to a bottom end of said front stop plate, and said positioning pin protrudes from a bottom end of said lower plate.

10. The locking device as claimed in claim 9, wherein said lower plate is formed with a through hole for extension of said upright plate therethrough, said front frame including two said supporting flat plates that are respectively disposed on left and right sides of said upright plate, said positioning frame including two said positioning pins, each of said positioning pins being engaged to said positioning hole in a respective one of said supporting flat plates.

11. The locking device as claimed in claim 2, wherein said retaining portion is configured as a hook, said positioning frame further including two retaining members projecting from said front stop plate and spaced apart from each other in a left-right direction, each of said retaining members being formed with a retaining hole, said locking member being rotatably received in said retaining holes of said retaining members and being releasably engaged to said retaining portion.

12. The locking device as claimed in claim 11, wherein said hook includes an upright arm, and a hook body that is formed on a top end of said upright arm and that has a hook portion, said locking member including two abutment rods that are spaced apart from each other in a left-right direction and that abut against said front stop plate, two pivot rods extending oppositely, outwardly and respectively from one ends of said abutment rods, two inclined rods extending forwardly, inclinedly and respectively from the other ends of said abutment rods that are opposite to said pivot rods, and a press rod interconnecting said inclined rods, said pivot rods being pivotally connected to said retaining holes in said retaining members, one of said inclined rods being engageable with said hook portion.

13. The locking device as claimed in claim 12, wherein said hook body further has an upper inclined surface to contact and push said one of said inclined rods toward the other one of said incline rods.

14. The locking device as claimed in claim 11, wherein said front frame includes two supporting flat plates respectively disposed on left and right sides of said retaining portion, said lower plate being connected to a bottom end of said front stop plate, said positioning pins projecting from a bottom end of said lower plate.

15. The locking device as claimed in claim 2, wherein said retaining portion is configured as a threaded hole that is formed in said supporting flat plate, said lower plate being connected to a bottom end of said front stop plate, said locking member including a fixed sleeve fixed to said lower plate, and a locking bolt that extends through and that is rotatable relative to said fixed sleeve, said locking bolt extending through said lower plate and threadedly engaging said threaded hole.

16. The locking device as claimed in claim 15, wherein said positioning pin projects from a bottom end of said lower plate, said locking bolt including a rotary sleeve rotatably sleeved on an outer periphery of said fixed sleeve, and a threaded rod section that extends from an inner surface of said rotary sleeve and that extends through said fixed sleeve to threadedly engage said threaded hole.

17. A locking device for fixing an electronic component to a housing, said locking device comprising:
- a rear stop frame adapted to be disposed on the housing for fixing a rear side of the electronic component, said rear stop frame including a rear stop plate for blocking a read end face of the electronic component, and a first top stop plate connected to a top end of said rear stop plate for blocking a top face of the electronic component;
- a front frame adapted to be disposed on the housing, said front frame being spaced apart from and in front of said rear stop frame, and including a retaining portion and at least one supporting flat plate, each supporting flat plate being formed with a positioning hole; and
- a locking mechanism including a positioning frame for fixing a front side of the electronic component, and a locking member, said positioning frame including a front stop plate for blocking a front end face of the electronic component, a second top stop plate connected to a top end of said front stop plate for blocking the top face of the electronic component, and two pivot plates adapted to be rotatably connected to the housing, said locking member being disposed on one of said pivot plates and being adapted to be releasably engaged to the housing, said positioning frame including a lower plate that abuts against said supporting flat plate, and at least one positioning pin that protrudes from said lower plate and that engages said positioning hole.

18. The locking device as claimed in claim 17, wherein said rear stop frame further includes a rear buffer pad that is disposed on said rear stop plate and that is adapted to abut against the rear end face of the electronic component, and a first buffer pad that is disposed on a bottom end of said first stop plate and that is adapted to abut against the top face of the electronic component, said positioning frame further including a front buffer pad that is disposed on said front stop plate and that is adapted to abut against the front end face of the electronic component, and a second buffer pad that is disposed on a bottom end of said second top stop plate and that is adapted to abut against the top face of the electronic component.

19. The locking device as claimed in claim 17, the housing includes a positioning part that is configured as a projection, wherein said locking member is configured as an engaging hole for engagement with the projection.

20. The locking device as claimed in claim 19, wherein said locking mechanism further includes a spring member having one end for connection with the housing and another end connected to said second top stop plate for biasing downwardly said positioning frame.

21. The locking device as claimed in claim 17, the housing includes a positioning part that is configured as an engaging hole, wherein said locking member includes a casing fixed to a corresponding said pivot plate, a locking bolt that extends through said casing and that is adapted to releasably engage the positioning part, and a biasing spring disposed in said casing for biasing said locking bolt toward the positioning part.

22. The locking device as claimed in claim 21, wherein said locking mechanism further includes a spring member having one end for connection with the housing and another end connected to said second top stop plate for biasing downwardly said positioning frame.

23. The locking device as claimed in claim 21, wherein said casing defines a passage hole, said locking bolt including a bolt rod that extends through said passage hole and that partially projects out of said casing, an annular flange that extends outwardly and radially from an outer peripheral surface of said bolt rod and that is disposed in said passage hole, and a bolt head disposed on an end of said bolt rod and that is located on an outer side of said casing, said biasing spring being sleeved on said bolt rod and abutting between said annular flange and said casing.

24. The locking device as claimed in claim 17, the housing includes a positioning part that is configured as a threaded hole, wherein one of said locking members includes a fixed sleeve fixed to a corresponding said pivot plate, and a locking bolt that extends through and that is rotatable relative to said fixed sleeve, said locking bolt extending through said pivot plate and being adapted to threadedly engage the threaded hole, said locking bolt including a rotary sleeve rotatably sleeved on an outer periphery of said fixed sleeve, and a threaded rod section that extends from an inner surface of said rotary sleeve and that extends through said fixed sleeve for threadedly engaging the threaded hole.

* * * * *